US011640951B2

(12) United States Patent
Cho et al.

(10) Patent No.: US 11,640,951 B2
(45) Date of Patent: May 2, 2023

(54) INTEGRATED CIRCUIT DEVICE HAVING REDISTRIBUTION PATTERN

(71) Applicant: SAMSUNG ELECTRONICS CO., LTD., Suwon-si (KR)

(72) Inventors: Yunrae Cho, Guri-si (KR); Jinyeol Yang, Cheonan-si (KR); Jungmin Ko, Hwaseong-si (KR); Seungduk Baek, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 323 days.

(21) Appl. No.: 16/846,616

(22) Filed: Apr. 13, 2020

(65) Prior Publication Data

US 2021/0066231 A1 Mar. 4, 2021

(30) Foreign Application Priority Data

Sep. 4, 2019 (KR) .......................... 10-2019-0109414

(51) Int. Cl.
*H01L 23/00* (2006.01)
*H01L 25/065* (2006.01)

(52) U.S. Cl.
CPC ............. *H01L 24/20* (2013.01); *H01L 24/05* (2013.01); *H01L 24/13* (2013.01); *H01L 24/29* (2013.01); *H01L 25/0655* (2013.01); *H01L 2224/0401* (2013.01); *H01L 2224/0557* (2013.01); *H01L 2224/13083* (2013.01); *H01L 2224/29008* (2013.01); *H01L 2224/29009* (2013.01); *H01L 2924/14* (2013.01)

(58) Field of Classification Search
CPC ......... H01L 24/20; H01L 24/05; H01L 24/13; H01L 25/0655; H01L 2224/0401; H01L 2224/0557; H01L 2224/13083; H01L 2224/29009
See application file for complete search history.

(56) References Cited

U.S. PATENT DOCUMENTS 8,343,437 B2  1/2013 Patel
8,384,172 B2  2/2013 Lee
(Continued)

FOREIGN PATENT DOCUMENTS

KR  10-2009-0121472 A  11/2009
KR  10-2013-0047060 A  5/2013

*Primary Examiner* — Tucker J Wright
(74) *Attorney, Agent, or Firm* — Sughrue Mion, PLLC

(57) ABSTRACT

An integrated circuit device includes a wiring structure, first and second inter-wiring insulating layers, redistributions patterns and a cover insulating layer. The wiring structure includes wiring layers having a multilayer wiring structure and via plugs. The first inter-wiring insulating layer that surrounds the wiring structure on a substrate. The second inter-wiring insulating layer is on the first inter-wiring insulating layer, and redistribution via plugs are connected to the wiring structure through the second inter-wiring insulating layer. The redistribution patterns includes pad patterns and dummy patterns on the second inter-wiring insulating layer. Each patterns has a thickness greater than a thickness of each wiring layer. The cover insulating layer covers some of the redistribution patterns. The dummy patterns are in the form of lines that extend in a horizontal direction parallel to the substrate.

20 Claims, 13 Drawing Sheets

(56) References Cited

U.S. PATENT DOCUMENTS

| | | |
|---|---|---|
| 10,008,393 B2 | 6/2018 | Kim et al. |
| 2011/0241202 A1* | 10/2011 | Liu .................. H01L 23/552 |
| | | 257/737 |
| 2014/0110712 A1* | 4/2014 | Saito ................. H01L 23/522 |
| | | 438/618 |
| 2018/0374792 A1 | 12/2018 | Wee et al. |
| 2019/0139888 A1 | 5/2019 | Yu et al. |

* cited by examiner

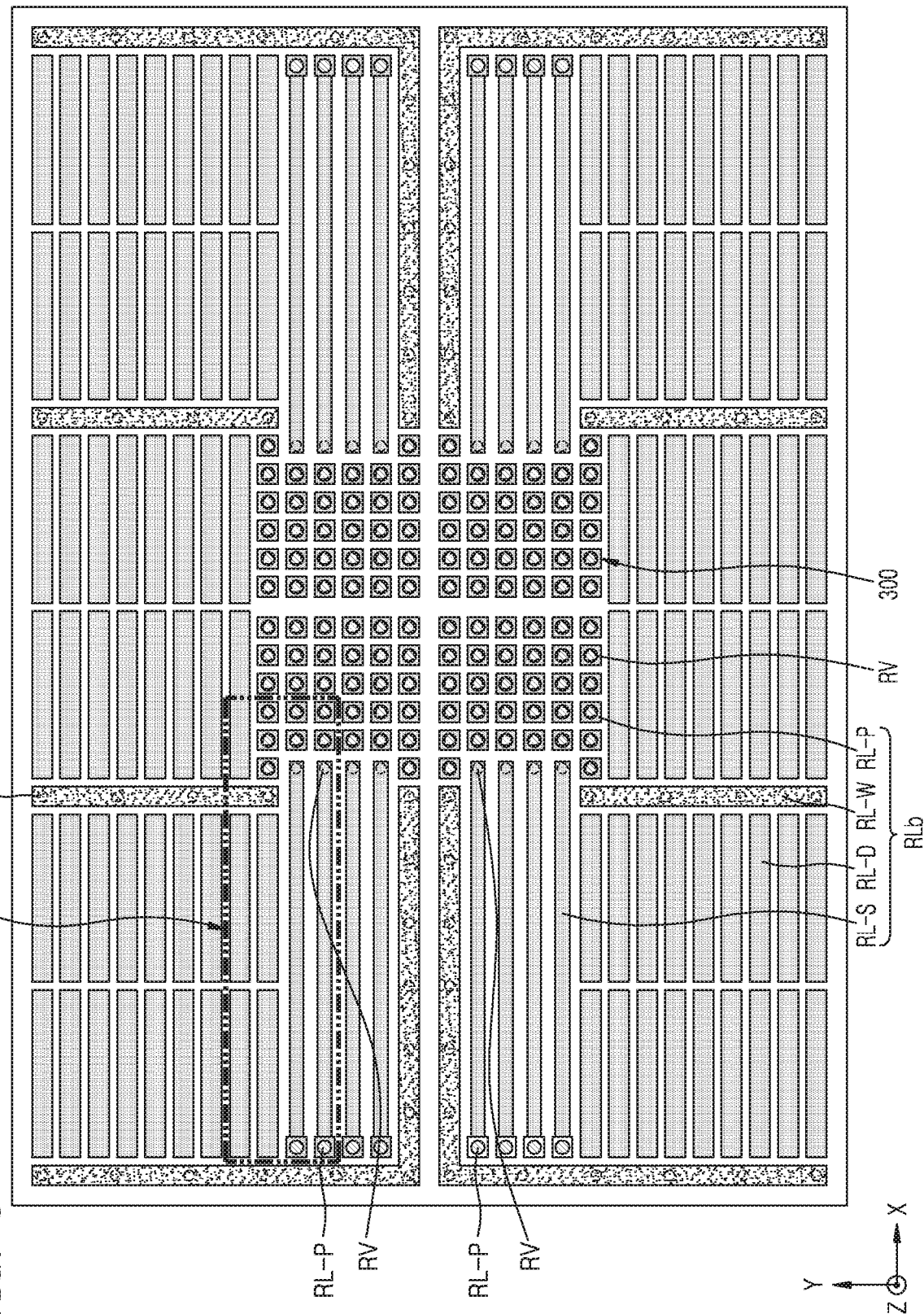

INTEGRATED CIRCUIT DEVICE HAVING
REDISTRIBUTION PATTERN

CROSS-REFERENCE TO RELATED
APPLICATION

This application claims priority from Korean Patent Application No. 10-2019-0109414, filed on Sep. 4, 2019, in the Korean Intellectual Property Office, the disclosure of which is incorporated by reference herein in its entirety.

BACKGROUND

1. Field

The present disclosure relates to an integrated circuit device, and more particularly, to an integrated circuit device having a redistribution pattern.

2. Description of Related Art

With the development of the electronics industry and demands of users, electronic devices have multiple functions and large capacities and are miniaturized and lightened. Therefore, integrated circuit devices used in the electronic devices need to have large degrees of integration. In order to stably supply power to highly integrated circuit devices or to secure the reliability of electric connections between the integrated circuit devices and the electronic devices, redistribution patterns electrically connected to wiring structures including wiring layers and via plugs are introduced.

SUMMARY

It is an aspect to provide an integrated circuit device having a redistribution pattern designed to increase the reliability of the integrated circuit device.

According to an aspect of one or more embodiments, there is provided an integrated circuit device. The integrated circuit device comprises a wiring structure including a plurality of wiring layers having a multilayer wiring structure and a plurality of via plugs, and a first inter-wiring insulating layer configured to surround the wiring structure on a substrate; a second inter-wiring insulating layer and a plurality of redistribution via plugs connected to the wiring structure through the second inter-wiring insulating layer on the first inter-wiring insulating layer; a plurality of redistribution patterns including a plurality of pad patterns and a plurality of dummy patterns on the second inter-wiring insulating layer, each of the plurality of pad patterns and each of the plurality of dummy patterns having a thickness greater than a thickness of each of the plurality of wiring layers; and a cover insulating layer configured to cover a portion of the plurality of redistribution patterns, wherein the plurality of dummy patterns extend in lines in a horizontal direction parallel to the substrate and are completely surrounded by the second inter-wiring insulating layer and the cover insulating layer so as to be electrically isolated from each other.

According to an aspect of one or more embodiments, there is provided an integrated circuit device comprising a wiring structure including a plurality of wiring layers having a multilayer wiring structure and a plurality of via plugs, and a first inter-wiring insulating layer configured to surround the wiring structure on a substrate; a second inter-wiring insulating layer and a plurality of redistribution via plugs connected to the wiring structure through the second inter-wiring insulating layer on the first inter-wiring insulating layer; a plurality of redistribution patterns including a plurality of pad patterns, a plurality of dummy patterns, and a plurality of power patterns on the second inter-wiring insulating layer, each of the plurality of pad patterns, the plurality of dummy patterns, and the plurality of power patterns having a thickness no less than twice a thickness of each of the plurality of wiring layers; a cover insulating layer configured to cover the plurality of dummy patterns and the plurality of power patterns and to not cover at least a portion of the plurality of pad patterns; and a plurality of connection terminals connected to the plurality of pad patterns, respectively, wherein the plurality of dummy patterns are in the form of lines that extend in a horizontal direction parallel to the substrate and are completely surrounded by the second inter-wiring insulating layer and the cover insulating layer so as to be electrically isolated from each other.

According to an aspect of one or more embodiments, there is provided an integrated circuit device comprising a device layer including a plurality of semiconductor devices on a substrate; a wiring structure including a plurality of wiring layers having a multilayer wiring structure including an uppermost wiring layer and a plurality of via plugs on the device layer; a first inter-wiring insulating layer configured to surround the wiring structure on the device layer; a second inter-wiring insulating layer on the first inter-wiring insulating layer and the wiring structure; a plurality of redistribution via plugs connected to the uppermost wiring layer through the second inter-wiring insulating layer; a plurality of redistribution patterns including a plurality of pad patterns, a plurality of dummy patterns and a plurality of power patterns, each of is the plurality of pad patterns being connected to one of a plurality of redistribution via plugs on the second inter-wiring insulating layer, each of the plurality of dummy patterns being in the form of a line that extends in a horizontal direction parallel to the substrate, and each of the plurality of power patterns being connected to at least two of the plurality of redistribution via plugs and having a thickness no less than twice a thickness of the uppermost wiring layer; a cover insulating layer configured to cover the plurality of dummy patterns and the plurality of power patterns; and a plurality of connection terminals that are connected to the plurality of pad patterns, respectively, each of the plurality of connection terminals including a conductive pillar and a conductive cap configured to cover an upper surface of the conductive pillar, wherein the plurality of dummy patterns are completely surrounded by the second inter-wiring insulating layer and the cover insulating layer and are electrically isolated from each other, and wherein, among an upper surface, side surfaces, and a lower surface of each of the plurality of power patterns, a portion that is not connected to the at least two redistribution via plugs is covered with the second inter-wiring insulating layer and the cover insulating layer.

BRIEF DESCRIPTION OF THE DRAWINGS

Various embodiments will be more clearly understood from the following detailed description taken in conjunction with the accompanying drawings, in which:

FIG. 6 is a plan layout diagram illustrating an integrated circuit device according to embodiments;

DETAILED DESCRIPTION

In this specification, the phrase "at least one of A or B" includes "only A", "only B", and "both A and B".

Figure 1A:
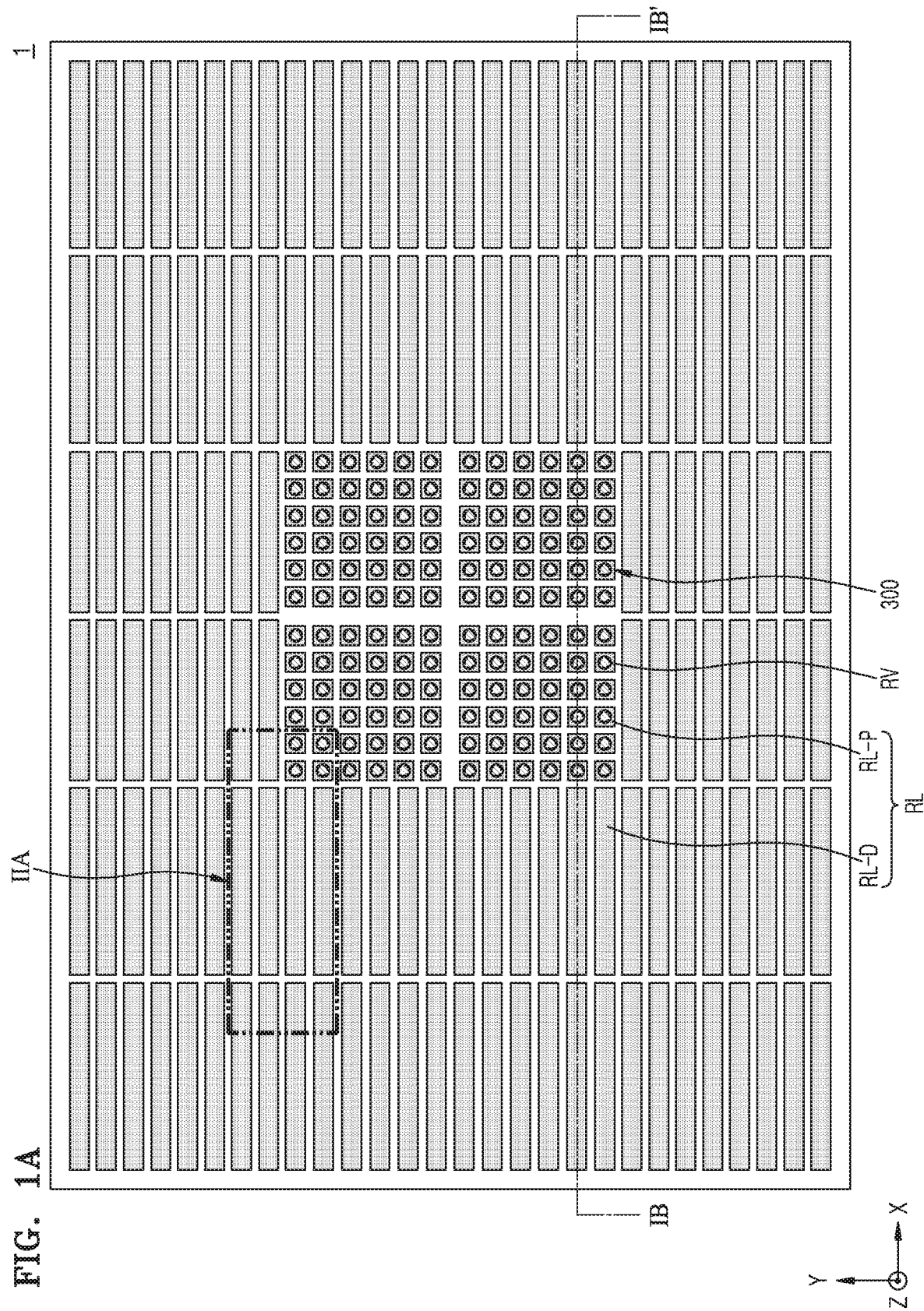
FIGS. 1A and 1B are a plan layout diagram and a cross-sectional view, respectively, illustrating an integrated circuit device according to embodiments.
Figure 1B:
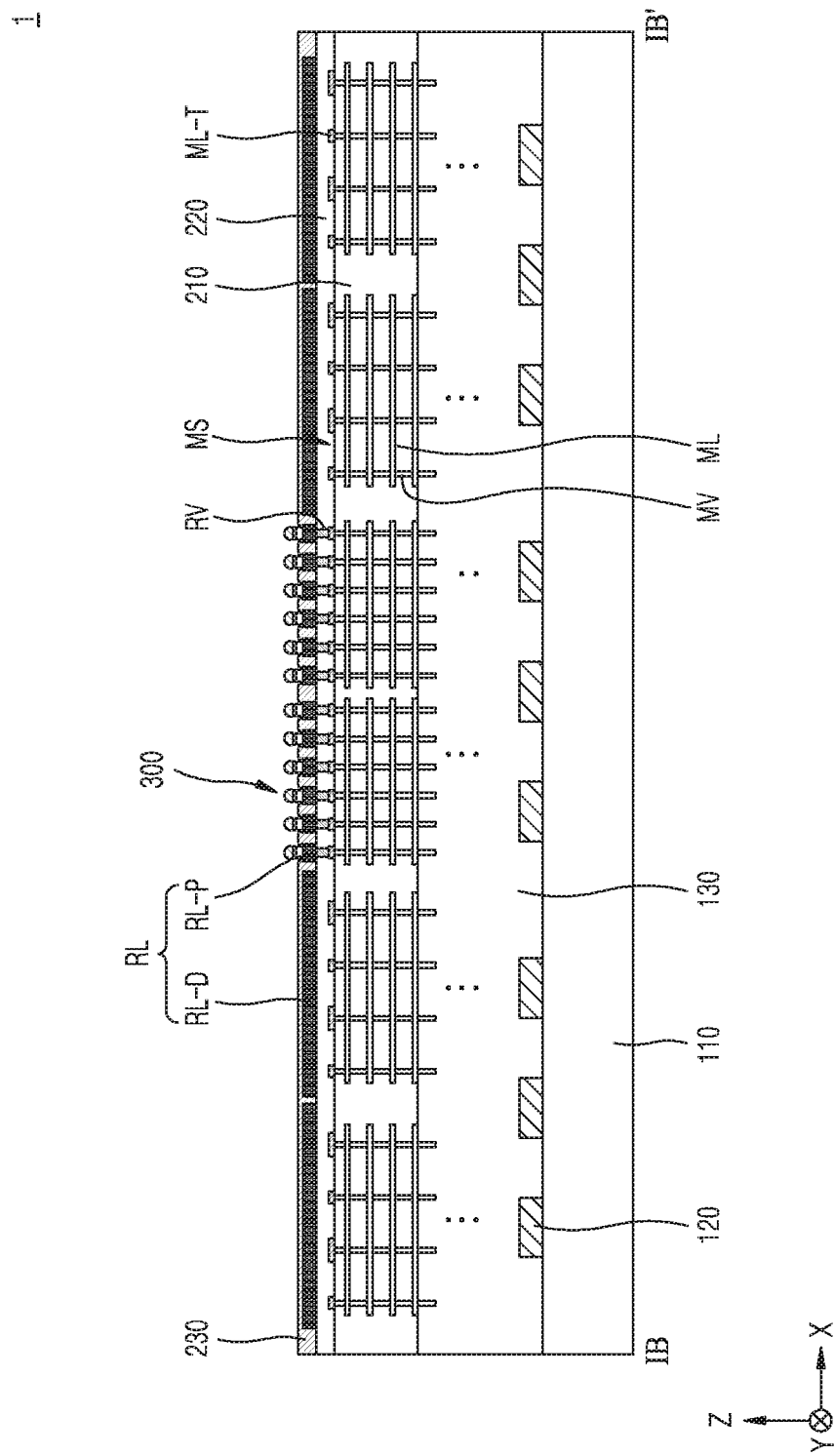

FIGS. 1A and 1B are a plan layout diagram and a cross-sectional view, respectively, illustrating an integrated circuit device according to embodiments. In detail, FIG. 1B is a cross-sectional view taken along the line IB-IB' of FIG. 1A.

Referring to FIGS. 1A and 1B, an integrated circuit device 1 includes a device layer 130 including a plurality of semiconductor devices 120 on a substrate 110. The substrate 110 may include, for example, silicon (Si). Alternatively, in some embodiments, the substrate 110 may include a semiconductor element such as germanium (Ge) or a compound semiconductor such as a silicon carbide (SiC), a gallium arsenide (GaAs), an indium arsenide (InAs), or an indium phosphide (InP). Alternatively, in some embodiments, the substrate 110 may have a silicon on insulator (SOI) structure. For example, the substrate 110 may include a buried oxide (BOX) layer. The substrate 110 may include a conductive region, for example, a well or structure doped with impurities. Alternatively, in some embodiments, the substrate 110 may have various device isolation structures such as a shallow trench isolation (STI) structure. The substrate 110 may have an active surface and an inactive surface opposite to the active surface.

A device layer 130 including the plurality of semiconductor devices 120 may be arranged on the active surface of the substrate 110. In FIG. 1B, it is illustrated that the plurality of semiconductor devices 120 are formed in a portion of the device layer 130 on the active surface of the substrate 110. However, embodiments is not limited thereto. For example, in some embodiments, the plurality of semiconductor devices 120 may be formed over a portion of the active surface of the substrate 110 and the device layer 130.

At least some of the plurality of semiconductor devices 120 may be transistors. For example, at least some of the plurality of semiconductor devices 120 may be bipolar junction transistors (BJT) or field effect transistors (FET). For example, at least some of the plurality of semiconductor devices 120 may be planar transistors or FinFET transistors. When at least some of the plurality of semiconductor devices 120 are FinFET transistors, on the substrate 110, a plurality of fin-type active regions may protrude and extend in parallel in a horizontal direction (an X direction or a Y direction).

In some embodiments, the plurality of semiconductor devices 120 may be various kinds of separate devices for forming a dynamic random access memory (DRAM) device, a static random access memory (SRAM) device, a flash memory device, an electrically erasable and programmable read-only memory (EEPROM) device, a phase-change random access memory (PRAM) device, a magnetic random access memory (MRAM) device, or a resistive random access memory (RRAM) device. For example, the plurality of semiconductor devices 120 may be various kinds of separate devices for forming a high bandwidth memory (HBM) DRAM device and the integrated circuit device 1 may be the HBM DRAM device.

In other embodiments, the plurality of semiconductor devices 120 may form a logic cell. The logic cell may be variously formed to include a plurality of circuit devices such as a transistor and a register. The logic cell may form, for example, AND, NAND, OR, NOR, exclusive OR (XOR), exclusive NOR (XNOR), an inverter INV, an adder ADD, a buffer BUF, a delay DLY, a filter FIL, a multiplexer MXT/MXIT, an OR/AND/INVERTER (OAI), and AND/OR (AO), an AND/OR/INVERTER (OAI), a D flip-flop, a reset flip-flop, a master-slave flip-flop, or a latch. The logic cell may form standard cells that perform a desired logical function such as a counter or a buffer. For example, the integrated circuit device 1 may be a central processing unit (CPU), a graphics processing unit (GPU), or an application processor (AP).

The device layer 130 may include the plurality of semiconductor devices 120, a conductive line and a conductive plug for connecting the plurality of semiconductor devices 120, an interlayer insulating layer that fills a space among the plurality of semiconductor devices 120, the conductive line, and the conductive plug. The device layer 130 may be formed of various kinds and shapes of conductive material, semiconductor material, and insulating material. In some embodiments, the interlayer insulating layer that fills the conductive line and the conductive plug may include an oxide.

Wiring structures MS and a first inter-wiring insulating layer 210 that surrounds the wiring structures MS may be arranged on the substrate 110 on which the device layer 130 is formed.

The wiring structures MS may include a plurality of wiring layers ML and a plurality of via plugs MV connected to the plurality of wiring layers ML. The plurality of wiring layers ML may have a multilayer wiring structure including the plurality of wiring layers ML positioned at different levels within the device layer 130. A connection relationship between the plurality of wiring layers ML and the plurality of via plugs MV that are illustrated in FIG. 1B is for exemplarily illustrating the multilayer wiring structure and may not illustrate an actual connection relationship.

In the current specification, a "level" means a height in a vertical direction (a Z direction) with respect to a main surface, for example, an upper surface of the substrate 110. That is, being positioned at the "same" level or at a "uniform" level means having a position in which the height in the vertical direction (the Z direction) with respect to the main surface of the substrate 110 is equal or uniform, and being positioned at "low" or "high" levels means having positions in which the height in the vertical direction (the Z direction) with respect to the main surface of the substrate 110 is small or large, respectively.

The wiring structures MS may include a metal material such as aluminum (Al), copper (Cu), or tungsten (W). In some embodiments, the wiring structures MS may include wiring barrier layers or wiring metal layers. The wiring barrier layers may be formed of a nitride or an oxide of a metal such as titanium (Ti), tantalum (Ta), ruthenium (R), manganese (Mn), or cobalt (Co), or W or an alloy such as a cobalt tungsten phosphide (CoWP), cobalt tungsten boron (CoWB), or a cobalt tungsten boron phosphide (CoWBP). The wiring metal layers may include at least one of W, Al, Ti, Ta, Ru, Mn, or Cu.

Each of the plurality of wiring layers ML may have a thickness of no more than 0.5 µm. In some embodiments, each of the uppermost wiring layers ML-T arranged at the uppermost ends of the plurality of wiring layers ML may have a thickness of no more than about 0.5 µm and each of the remaining wiring layers ML may have a thickness of no more than about 0.3 µm, which is less than the thickness of each of the uppermost wiring layers ML-T.

Some of the uppermost wiring layers ML-T arranged at the uppermost ends of the plurality of wiring layers ML may function as sub-pads electrically connected to pad patterns RL-P among a plurality of redistribution patterns RL. A plurality of connection terminals 300 may be respectively arranged on the pad patterns RL-P. Others of the uppermost wiring layers ML-T may function as wiring lines for electrically connecting the plurality of wiring layers ML and the plurality of via plugs MV that form the wiring structures MS to each other.

Via plugs MV arranged at the lowermost ends of the plurality of via plugs MV may extend from lower surfaces of the plurality of wiring layers ML toward the device layer 130. The wiring structures MS may be electrically connected to the plurality of semiconductor devices 120. The plurality of via plugs MV may extend from the lower surfaces of the plurality of wiring layers ML having the multilayer wiring structure and positioned at different levels toward the substrate 110.

Some of the plurality of via plugs MV may connect the plurality of wiring layers ML positioned at different levels to each other and others of the plurality of via plugs MV may connect some of the plurality of wiring layers ML and the plurality of semiconductor devices 120 to each other or some of the plurality of wiring layers ML and the substrate 110 to each other. For example, via plugs MV arranged at the lowermost ends of the plurality of via plugs MV may connect wiring layers ML arranged at the lowermost ends of the plurality of wiring layers ML and the plurality of semiconductor devices 120 or the substrate 110 to each other.

The first inter-wiring insulating layer 210 may have a multilayer structure in which a plurality of low-k dielectric insulating layers are stacked to correspond to the multilayer wiring structure of the plurality of wiring layers ML. In some embodiments, the first inter-wiring insulating layer 210 may be formed of an insulating material having a dielectric constant less than that of Si oxide. For example, in some embodiments, the first inter-wiring insulating layer 210 may include an ultra-low K (ULK) layer having an ultra-low dielectric constant K of about 2.2 to about 2.4. The ULK layer may include a SiOC layer or a SiCOH layer. The first inter-wiring insulating layer 210 may be referred to as low-k dielectric insulating layers.

In other embodiments, the first inter-wiring insulating layer 210 may have a multilayer structure in which an insulating material with a dielectric constant less than that of Si oxide and another insulating material with a dielectric constant equal to or greater than that of Si oxide are stacked. For example, at least one of the multilayer structure of the first inter-wiring insulating layer 210 may include an oxide layer or a nitride layer. For example, the first inter-wiring insulating layer 210 may include an etching stop layer formed of a nitride, which is used in a process of forming the plurality of wiring layers ML. However, a ratio of the etching stop layer formed of a nitride to the first inter-wiring insulating layer 210 may be very low.

A second inter-wiring insulating layer 220 and redistribution via plugs RV connected to the wiring structures MS through the second inter-wiring insulating layer 220 may be formed on the wiring structures MS and the first inter-wiring insulating layer 210.

The second inter-wiring insulating layer 220 may include an oxide layer, a nitride layer, a carbide layer, polymer, or a combination of these compounds. The second inter-wiring insulating layer 220 may be formed of an insulating material with a dielectric constant greater than that of the first inter-wiring insulating layer 210. For example, the second inter-wiring insulating layer 220 may be formed of an oxide. In some embodiments, the second inter-wiring insulating layer 220 may be formed of tetraethyl orthosilicate (TEOS). In some embodiments, a level of an upper surface of the second inter-wiring insulating layer 220 may be generally uniform.

In some embodiments, the redistribution via plugs RV may include a barrier layer and a metal layer. The barrier layer may be formed of a nitride or an oxide of a metal such as Ti, Ta, Ru, Mn, Co, or W or an alloy such as CoWP, CoWB, or CoWBP. The metal layer may include at least one of W, Al, Ti, Ta, Ru, Mn, or Cu.

In FIG. 1B, it is illustrated that the uppermost wiring layers ML-T among the plurality of wiring layers ML are arranged on the first inter-wiring insulating layer 210 so that lower surfaces of the uppermost wiring layers ML-T and a lower surface of the second inter-wiring insulating layer 220 are positioned at the same level. However, embodiments are not limited thereto. In some embodiments, upper surfaces of the uppermost wiring layers ML-T may be positioned at the same level as an upper surface of the first inter-wiring insulating layer 210.

The plurality of redistribution patterns RL may be arranged on the second inter-wiring insulating layer 220 and the redistribution via plugs RV. A thickness of each of the plurality of redistribution patterns RL may have a value greater than that of a thickness of each of the plurality of wiring layers ML. For example, the thickness of each of the plurality of redistribution patterns RL may have a value of no less than twice that of the thickness of each of the plurality of wiring layers ML. In some embodiments, the thickness of each of the plurality of redistribution patterns RL may be about 1 µm to about 5 µm. In some embodiments, a ratio between a planar area of the plurality of redistribution patterns RL and a planar area of intervals among the plurality of redistribution patterns RL may be about 3.5:1 to about 4.5:1.

The plurality of redistribution patterns RL may include a plurality of pad patterns RL-P and a plurality of dummy patterns RL-D. In some embodiments, the plurality of redistribution patterns RL may include a barrier layer and a metal layer. The barrier layer may be formed of a nitride or an oxide of a metal such as Ti, Ta, Ru, Mn, Co, or W or an alloy such as CoWP, CoWB, or CoWBP. The metal layer may include at least one of W, Al, Ti, Ta, Ru, Mn, or Cu.

Lower surfaces of the plurality of pad patterns RL-P may contact upper surfaces of the redistribution via plugs RV, respectively, so that the plurality of pad patterns RL-P may be electrically connected to the wiring structures MS through the plurality of redistribution via plugs RV, respectively. Lower surfaces of the plurality of dummy patterns RL-D may contact an upper surface of the second inter-wiring insulating layer 220 so that the plurality of dummy patterns RL-D may be electrically isolated from the wiring structures MS with the second inter-wiring insulating layer 220 therebetween.

The plurality of pad patterns RL-P may be arranged in at least one column in the horizontal direction (the X direction or the Y direction). In some embodiments, the plurality of pad patterns RL-P may be horizontally in a matrix. The plurality of connection terminals 300 may be connected on the plurality of pad patterns RL-P, respectively. For example, the plurality of pad patterns RL-P may be center pads two-dimensionally arranged in the center of the integrated circuit device 1. However, embodiments are not limited thereto. In some embodiments, the plurality of pad patterns RL-P may be edge pads two-dimensionally arranged to be adjacent to edges of the integrated circuit device 1.

Each of the plurality of dummy patterns RL-D may be in the form of a line that extends in the first horizontal direction (the X direction) or the second horizontal direction (the Y direction). In FIG. 1A, it is illustrated that the plurality of dummy patterns RL-D are in the form of lines that extend in the same direction, that is, the first horizontal direction (the X direction). However, embodiments are not limited thereto. For example, some of the plurality of dummy patterns RL-D are in the form of lines that extend in the first horizontal direction (the X direction) and the remaining dummy patterns RL-D are in the form of lines that extend in the second horizontal direction (the Y direction) perpendicular to the first horizontal direction (the X direction).

Each of the plurality of dummy patterns RL-D may be in the form of a line that extends with a width of no less than about 20 μm and a length of no less than about 100 μm. For example, each of the plurality of dummy patterns RL-D may have a length of about 100 μm to about 400 μm. For example, a ratio between the length and the width of each of the plurality of dummy patterns RL-D may be about 5:1 to about 20:1. The plurality of dummy patterns RL-D may be arranged at intervals of no more than about 10 μm. In some embodiments, a ratio between a planar area of the plurality of dummy patterns RL-D and a planar area of intervals among the plurality of dummy patterns RL-D may be about 3.5:1 to about 4.5:1.

In FIG. 1A, it is exemplarily illustrated that the plurality of dummy patterns RL-D extend with the same width and the same length. However, embodiments are not limited thereto. In some embodiments, the ratio between the length and the width of each of the plurality of dummy patterns RL-D is about 5:1 to about 20:1 and a length or a width of each of some of the plurality of dummy patterns RL-D may have a value different from that of a length or a width of each of others of the plurality of dummy patterns RL-D. Alternatively, in some embodiments, the ratio between the planar area of the plurality of dummy patterns RL-D and the planar area of the intervals among the plurality of dummy patterns RL-D may be about 3.5:1 to about 4.5:1 and the length or the width of each of some of the plurality of dummy patterns RL-D may have a value different from that of the length or the width of each of others of the plurality of dummy patterns RL-D.

Each of the plurality of pad patterns RL-P may be two-dimensionally square or two-dimensionally rectangular. In some embodiments, a ratio between a planar area of the plurality of pad patterns RL-P and a planar area of intervals among the plurality of pad patterns RL-P may have the same value as the ratio between the planar area of the plurality of dummy patterns RL-D and the planar area of the intervals among the plurality of dummy patterns RL-D. For example, the ratio between the planar area of the plurality of pad patterns RL-P and the planar area of the intervals among the plurality of pad patterns RL-P may be about 3.5:1 to about 4.5:1.

In some embodiments, the plurality of redistribution patterns RL may further include a redistribution pattern for transmitting power and/or a redistribution pattern for transmitting a signal other than the plurality of pad patterns RL-P and the plurality of dummy patterns RL-D.

A cover insulating layer 230 may be formed on the second inter-wiring insulating layer 220 and the plurality of redistribution patterns RL. The cover insulating layer 230 may cover the plurality of dummy patterns RL-D of the plurality of redistribution patterns RL.

The plurality of dummy patterns RL-D may be completely surrounded by the second inter-wiring insulating layer 220 and the cover insulating layer 230 and may be spaced apart and electrically isolated from each other. In addition, the plurality of dummy patterns RL-D may be completely surrounded by the second inter-wiring insulating layer 220 and the cover insulating layer 230 and may be electrically isolated from the other conductive components of the integrated circuit device 1. For example, upper and side surfaces of the plurality of dummy patterns RL-D may be covered with the cover insulating layer 230 and the lower surfaces of the plurality of dummy patterns RL-D may be covered with the second inter-wiring insulating layer 220. In some embodiments, the upper surfaces of the plurality of dummy patterns RL-D may be covered with the cover insulating layer 230 and the side and lower surfaces of the plurality of dummy patterns RL-D may be covered with the second inter-wiring insulating layer 220.

The cover insulating layer 230 may not cover some of upper surfaces of the plurality of pad patterns RL-P of the plurality of redistribution patterns RL. The plurality of connection terminals 300 may be arranged on the remaining portions of the upper surfaces of the plurality of pad patterns RL-P, which are not covered with the cover insulating layer 230 and are exposed. Some of the lower surfaces of the plurality of pad patterns RL-P may be covered with the second inter-wiring insulating layer 220 and the remaining portions of the lower surfaces of the plurality of pad patterns RL-P, which are not covered with the second inter-wiring insulating layer 220, may be connected to the plurality of redistribution via plugs RV, respectively. The cover insulating layer 230 may cover side surfaces of the plurality of pad patterns RL-P. In some embodiments, the side surfaces of the plurality of pad patterns RL-P may be covered with the second inter-wiring insulating layer 220.

The cover insulating layer 230 may be formed of, for example, photosensitive polyimide (PSPI). In some embodiments, the cover insulating layer 230 may have a multilayer structure in which at least two insulating layers are stacked. For example, the cover insulating layer 230 may have a multilayer structure in which a layer formed of a nitride and a layer formed of PSPI are stacked.

Alternatively, in some embodiments, the cover insulating layer 230 may be formed of, for example, an oxide. In some embodiments, the cover insulating layer 230 may be formed of TEOS. The cover insulating layer 230 may have a multilayer structure in which at least two insulating layers are stacked. For example, the cover insulating layer 230 may have a multilayer structure in which a layer formed of a nitride and a layer formed of TEOS are stacked.

Although the plurality of redistribution patterns RL are formed to be thick in the integrated circuit device 1, since the plurality of redistribution patterns RL two-dimensionally have a uniform density, that is, a ratio between a planar area of the plurality of redistribution patterns RL and a planar area of the intervals among the plurality of redistribution patterns RL is about 3.5:1 to about 4.5:1, it is possible to prevent the integrated circuit device 1 from being bent due to the plurality of redistribution patterns RL. Therefore, the reliability of the integrated circuit device 1 may increase and the reliability of electric connection between the plurality of connection terminals 300 arranged on the plurality of pad patterns RL-P and an external device may increase.

When the plurality of redistribution patterns RL are formed to be thick, since distortion may occur at planar shapes of the plurality of redistribution patterns RL due to grain boundaries among metal layers that form the plurality of redistribution patterns RL, it may be difficult to detect defects in the plurality of redistribution patterns RL. However, since the plurality of redistribution patterns RL in the integrated circuit device 1 include the plurality of dummy patterns RL-D having a large width and length, distortion that occurs at the planar shapes of the plurality of redistribution patterns RL due to the grain boundaries may be minimized. Therefore, since defects that may occur in the plurality of redistribution patterns RL may be easily detected, the integrated circuit device 1 without a defect may be formed.

Figure 2A:
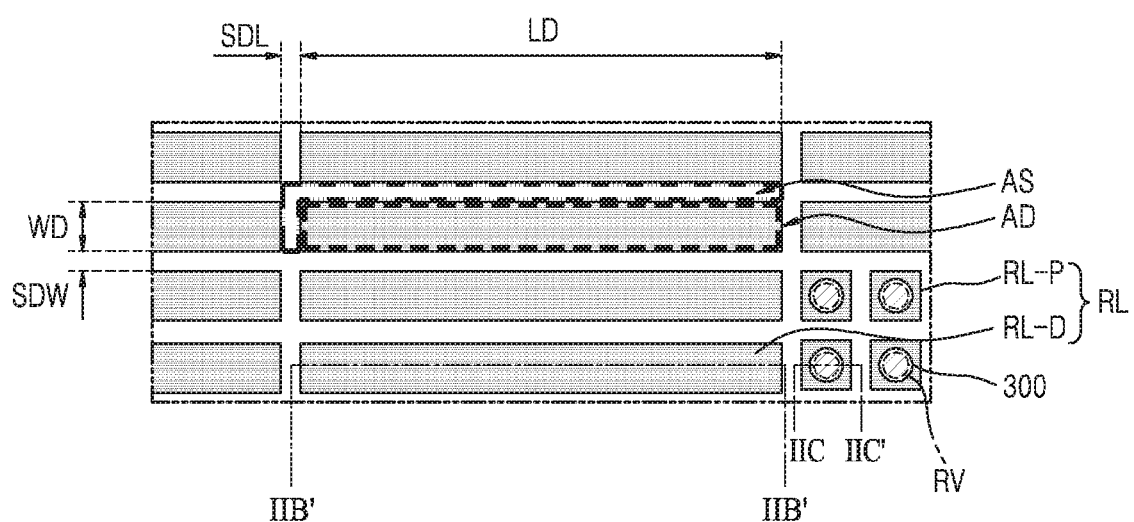
FIG. 2A is a plan layout diagram and FIGS. 2B to 2C are cross-sectional views illustrating an integrated circuit device according to embodiments.
Figure 2B:
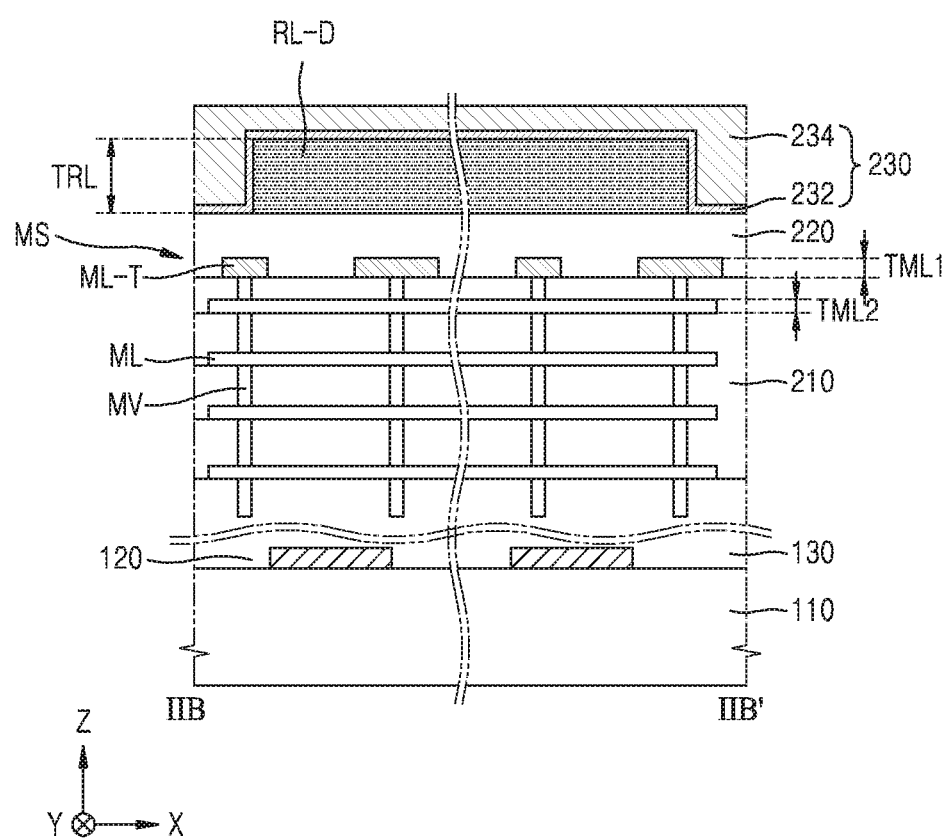
Figure 2C:
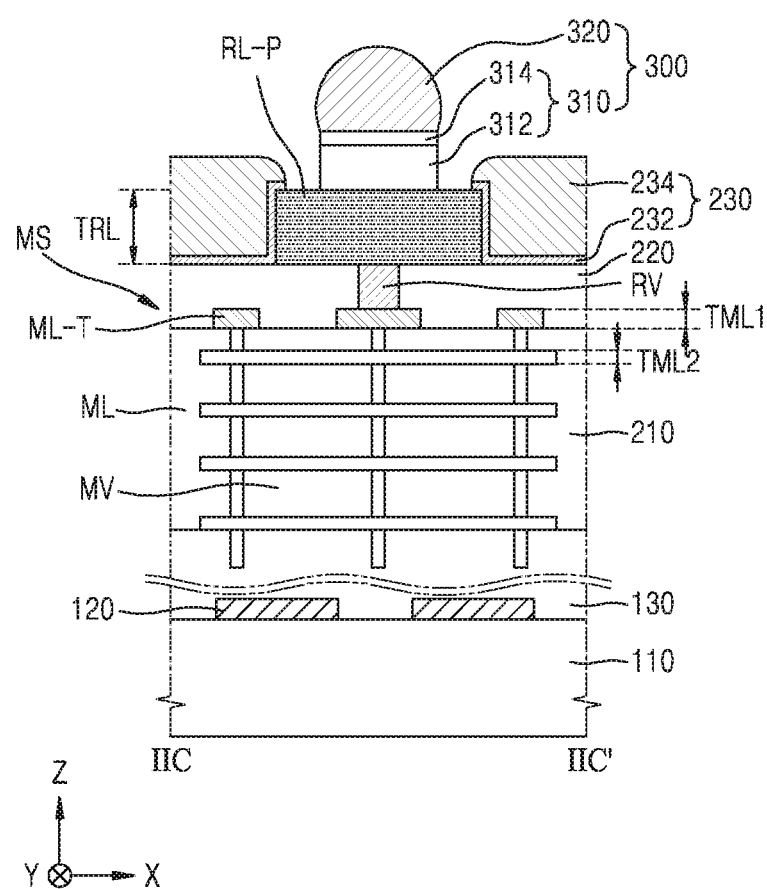

FIG. 2A is a plan view and FIGS. 2B to 2C are cross-sectional views illustrating an integrated circuit device according to embodiments. In detail, FIG. 2A is a plan layout diagram illustrating an enlargement of the region IIA of FIG. 1A and FIGS. 2B and 2C are cross-sectional views taken along the line IIB-IIB' and the line IIC-IIC' of FIG. 2A.

Referring to FIG. 2A, the plurality of redistribution patterns RL may include the plurality of pad patterns RL-P and the plurality of dummy patterns RL-D. As shown in FIG. 2C, the plurality of redistribution via plugs RV may be connected to the lower surfaces of the plurality of pad patterns RL-P, respectively. The plurality of connection terminals 300 may be connected to the upper surfaces of the plurality of pad patterns RL-P, respectively. The plurality of pad patterns RL-P may electrically connect the plurality of connection terminals 300 and the plurality of redistribution via plugs RV respectively to each other.

Each of the plurality of dummy patterns RL-D may be in the form of a line that extends in the first horizontal direction (the X direction) or the second horizontal direction (the Y direction).

Each of the plurality of dummy patterns RL-D may be in the form of a line that extends with a first width WD and a first length LD. For example, the first width WD may have a value of no less than about 20 μm. For example, the first length LD may have a value of about 100 μm to about 400 μm. In some embodiments, a ratio between the first length LD and the first width WD may be about 5:1 to about 20:1.

The plurality of dummy patterns RL-D may be spaced apart from each other in a longitudinal direction at first longitudinal direction (i.e., in the X direction in FIG. 2A) intervals SDL and in a width direction (i.e., the Y direction in the example of FIG. 2A) at first width direction intervals SDW. Each of the first longitudinal direction interval SDL and the first width direction interval SDW may have a value of no more than one half (½) of the first width WD. For example, the first longitudinal direction interval SDL may have a value of no more than about 10 μm. For example, the first width direction interval SDW may have a value of no more than about 10 μm. In some embodiments, the first longitudinal direction interval SDL and the first width direction interval SDW may have the same value or similar values.

In some embodiments, the ratio between the planar area of the plurality of dummy patterns RL-D and the planar area of the intervals among the plurality of dummy patterns RL-D may be about 3.5:1 to about 4.5:1. In FIG. 2A, as an example, a planar pattern area AD of one of the plurality of dummy patterns RL-D and a planar interval area AS of an interval corresponding to one dummy pattern RL-D on average are illustrated. A ratio between the pattern area AD and the interval area AS may be about 3.5:1 to about 4.5:1.

Each of the plurality of pad patterns RL-P may be two-dimensionally square or two-dimensionally rectangular. A width and height of a square of each of the plurality of pad patterns RL-P and the intervals among the plurality of pad patterns RL-P may be selected in accordance with a width of each of the plurality of connection terminals 300 and intervals among the plurality of connection terminals 300. The width of each of the plurality of connection terminals 300 and the intervals among the plurality of connection terminals 300 may be variously selected in view of an electric connection between the integrated circuit device 1 (FIGS. 1A and 1B) and an external device.

For example, the width and height of the square of each of the plurality of pad patterns RL-P may have the same value as the first width WD as illustrated in FIG. 2A. However, embodiments are not limited thereto. In some embodiments, the width and height of the square of each of the plurality of pad patterns RL-P may have a value greater than that of the first width WD. In other embodiments, the width and height of the square of each of the plurality of pad patterns RL-P may have a value less than that of the first width WD.

In some embodiments, the ratio between the planar area of the plurality of pad patterns RL-P and the planar area of the intervals among the plurality of pad patterns RL-P may have the same value as the ratio between the planar area of the plurality of dummy patterns RL-D and the planar area of the intervals among the plurality of dummy patterns RL-D. For example, the ratio between the planar area of the plurality of pad patterns RL-P and the planar area of the intervals among the plurality of pad patterns RL-P may be about 3.5:1 to about 4.5:1.

Referring to FIGS. 2B and 2C, each of the plurality of dummy patterns RL-D may be completely surrounded by the second inter-wiring insulating layer 220 and the cover insulating layer 230 to be electrically isolated from the outside and may be electrically floated. Therefore, the plurality of dummy patterns RL-D may be spaced apart from and electrically isolated from each other and may be electrically isolated from the other conductive components of the integrated circuit device 1.

Each of the uppermost wiring layers ML-T arranged at the uppermost ends of the plurality of wiring layers ML may have a first thickness TML1, and each of the remaining wiring layers excluding the uppermost wiring layers ML-T among the plurality of wiring layers ML may have a second thickness TML2. For example, the first thickness TML1 may have a value of no more than about 0.5 μm. For example, the second thickness TML2 may have a value less than that of the first thickness TML1. For example, the second thickness TML2 may have a value of no more than about 0.3 μm. In FIGS. 2B and 2C, it is illustrated that the remaining wiring layers excluding the uppermost wiring layers ML-T among the plurality of wiring layers ML have the same thickness. However, embodiments are not limited thereto. For example, among the remaining wiring layers excluding the uppermost wiring layers ML-T among the plurality of wiring layers ML, one or more wiring layers ML may have different thicknesses from each other.

Each of the plurality of redistribution patterns RL may have a third thickness TRL. In some embodiments, the third thickness TRL may have a value of no less than twice that of the first thickness TML1. For example, the third thickness TRL may be about 1 μm to about 5 μm.

The cover insulating layer 230 may surround side surfaces of the dummy pattern RL-D and the pad pattern RL-P. The cover insulating layer 230 may cover the upper surface of the dummy pattern RL-D. The cover insulating layer 230 may cover a part of the upper surface of the pad pattern RL-P and may expose the remaining part, as illustrated in FIG. 2C.

On the part exposed without being covered with the cover insulating layer 230 of the upper surface of each of the plurality of pad patterns RL-P, the connection terminal 300 may be arranged, as illustrated in FIG. 2C. In some embodiments, the cover insulating layer 230 and the connection terminal 300 may be spaced apart from each other. Between the cover insulating layer 230 and the connection terminal 300, the upper surface of each of the plurality of pad patterns RL-P may be exposed to the outside without being covered with the cover insulating layer 230 and the connection terminal 300.

The cover insulating layer 230 may include a first cover insulating layer 232 and a second cover insulating layer 234 provided on the first cover insulating layer 232. The first cover insulating layer 232 may conformally cover the upper surface of the second inter-wiring insulating layer 220 and some of surfaces of the plurality of redistribution patterns RL (for example, at least a part of an upper surface and side surfaces of the redistribution pattern RL). For example, the first cover insulating layer 232 may be formed of a nitride. The second cover insulating layer 234 may cover the first cover insulating layer 232. The second cover insulating layer 234 may be thicker than the first cover insulating layer 232. For example, the second cover insulating layer 234 may be formed of PSPI. Alternatively, in some embodiments, for example, the second cover insulating layer 234 may be formed of an oxide such as TEOS.

The connection terminal 300 may include a conductive pillar 310 provided on the pad pattern RL-P and a conductive cap 320 that covers an upper surface of the conductive pillar 310, as illustrated in FIG. 2C.

In some embodiments, the conductive pillar 310 may include a base pillar 312 and a cover pillar 314 formed on an upper surface of the base pillar 312. The cover pillar 314 may cover the upper surface of the base pillar 312. The base pillar 312 may include, for example, copper (Cu), and the cover pillar 314 may include, for example, at least one of nickel (Ni), Cu, palladium (Pd), platinum (Pt), or gold (Au). In some embodiments, the cover pillar 314 may include Ni. In other embodiments, the cover pillar 314 may have a multilayer structure including a first layer including Ni and a second layer covering the first layer and including Cu.

The conductive cap 320 may connect the integrated circuit device 1 (FIGS. 1A and 1B) to an external device (not shown) and may electrically connect the integrated circuit device 1 and the external device to each other. The conductive cap 32 may include, for example, at least one of tin (Sn), indium (In), bismuth (Bi), antimony (Sb), Cu, silver (Ag), Au, zinc (Zn), or lead (Pb).

In FIG. 2C, it is illustrated that the redistribution via plug RV, the uppermost wiring layer ML-T on which the redistribution via plug RV is arranged, and the connection terminal 300 are aligned in the vertical direction (the Z direction). However, embodiments are not limited thereto. In some embodiments, in the pad pattern RL-P, a portion that contacts the connection terminal 300 and a portion connected to the redistribution via plug RV may be spaced apart from each other in the horizontal direction (the X direction, the Y direction, or an X-Y direction). In this configuration, at least some of the plurality of connection terminals 300 and the plurality of redistribution via plugs RV that correspond to each other may be unaligned in the vertical direction (the Z direction). In this configuration, at least some of the plurality of pad patterns RL-P may function as redistribution layers for horizontally dispersing arrangement of the plurality of connection terminals 300 rather than arrangement of the plurality of uppermost wiring layers ML-T on which the plurality of redistribution via plugs RV are arranged so as to function as sub-pads.

Figure 3:
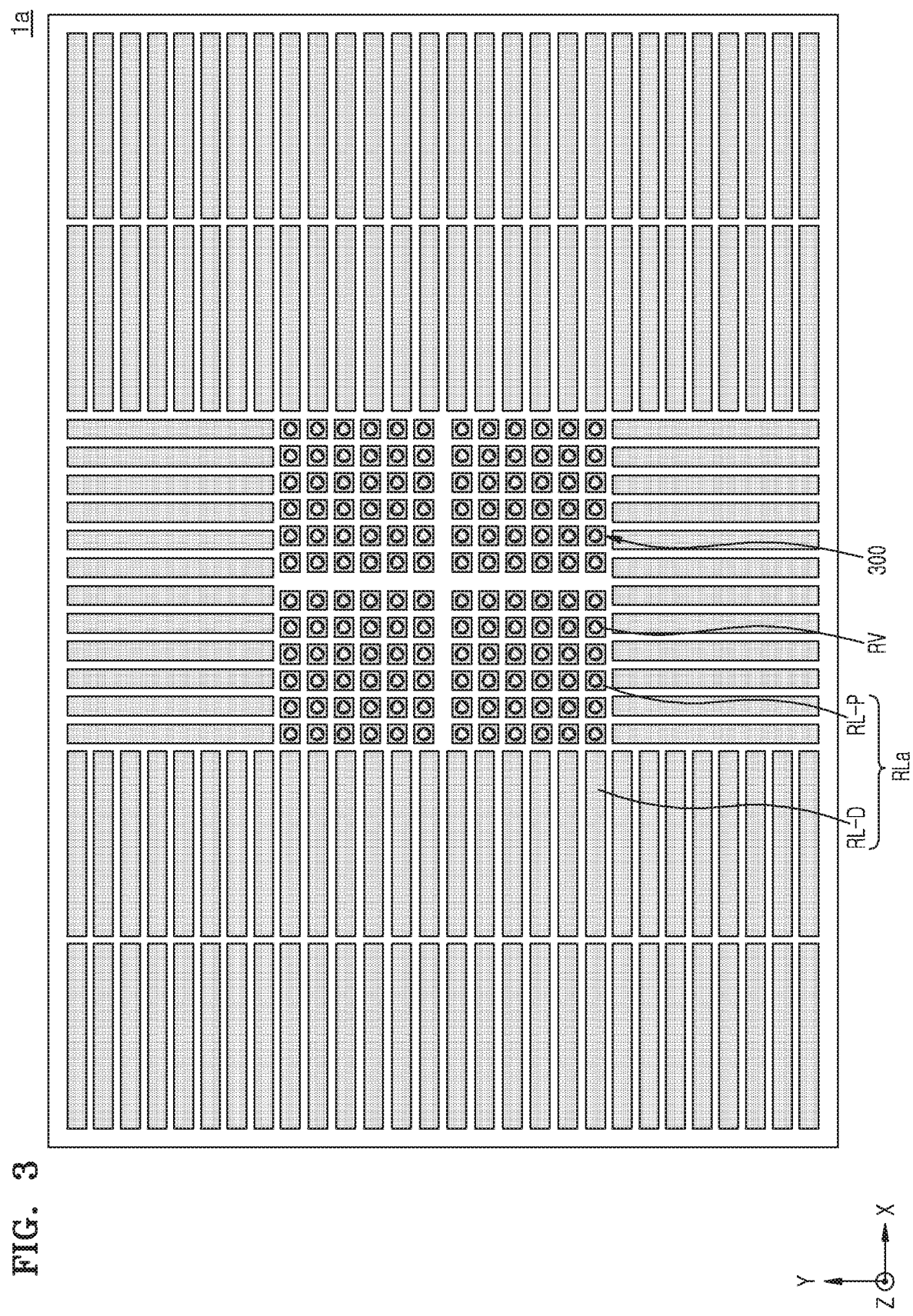
FIG. 3 is a plan layout diagram illustrating an integrated circuit device according to embodiments.

FIG. 3 is a plan layout diagram illustrating an integrated circuit device according to embodiments. Like reference numerals refer to like elements throughout. In the description of FIG. 3, repeated description of elements previously described with reference to FIGS. 1A to 2C, may be omitted for conciseness.

Referring to FIG. 3, an integrated circuit device 1a includes a plurality of redistribution patterns RLa. The plurality of redistribution patterns RLa may include a plurality of pad patterns RL-P and a plurality of dummy patterns RL-D.

The plurality of pad patterns RL-P may be arranged to form at least one column in the horizontal direction (the X direction or the Y direction). In some embodiments, the plurality of pad patterns RL-P may be horizontally arranged in a matrix. The plurality of connection terminals 300 may be connected to the plurality of pad patterns RL-P, respectively.

Each of the plurality of dummy patterns RL-D may be in the form of a line that extends in the first horizontal direction (the X direction) or the second horizontal direction (the Y direction). The plurality of dummy patterns RL-D may be in the form of lines that extend in different directions. For example, some of the plurality of dummy patterns RL-D may be in the form of lines that extend in the first horizontal direction (the X direction) and others of the plurality of dummy patterns RL-D may be in the form of lines that extend in the second horizontal direction (the Y direction) perpendicular to the first horizontal direction (the X direction), as illustrated in FIG. 3.

Each of the plurality of dummy patterns RL-D may be in the form of a line that extends with a width of no less than about 20 μm and a length of about 100 μm to about 400 μm. For example, a ratio between the length and the width of each of the plurality of dummy patterns RL-D may be about 5:1 to about 20:1. The plurality of dummy patterns RL-D may be arranged at intervals of no more than about 10 μm. In some embodiments, a ratio between a planar area of the plurality of dummy patterns RL-D and a planar area of intervals among the plurality of dummy patterns RL-D may be about 3.5:1 to about 4.5:1.

Among the plurality of dummy patterns RL-D, some dummy patterns RL-D that extend in the first horizontal direction (the X direction) and other dummy patterns RL-D that extend in the second horizontal direction (the Y direction) may have the same width and length. However, embodiments are not limited thereto. In some embodiments, the ratio between the length and the width of each of the plurality of dummy patterns RL-D is about 5:1 to about 20:1 and a length or width of each of some dummy patterns RL-D that extend in the first horizontal direction (the X direction) may have a value different from that of a length or width of each of other dummy patterns RL-D that extend in the second horizontal direction (the Y direction). Alternatively, in some embodiments, although the ratio between the length and width of each of the plurality of dummy patterns RL-D that extend in the same direction is about 5:1 to about 20:1, each of the plurality of dummy patterns RL-D may have a different length and/or width.

Figure 4:
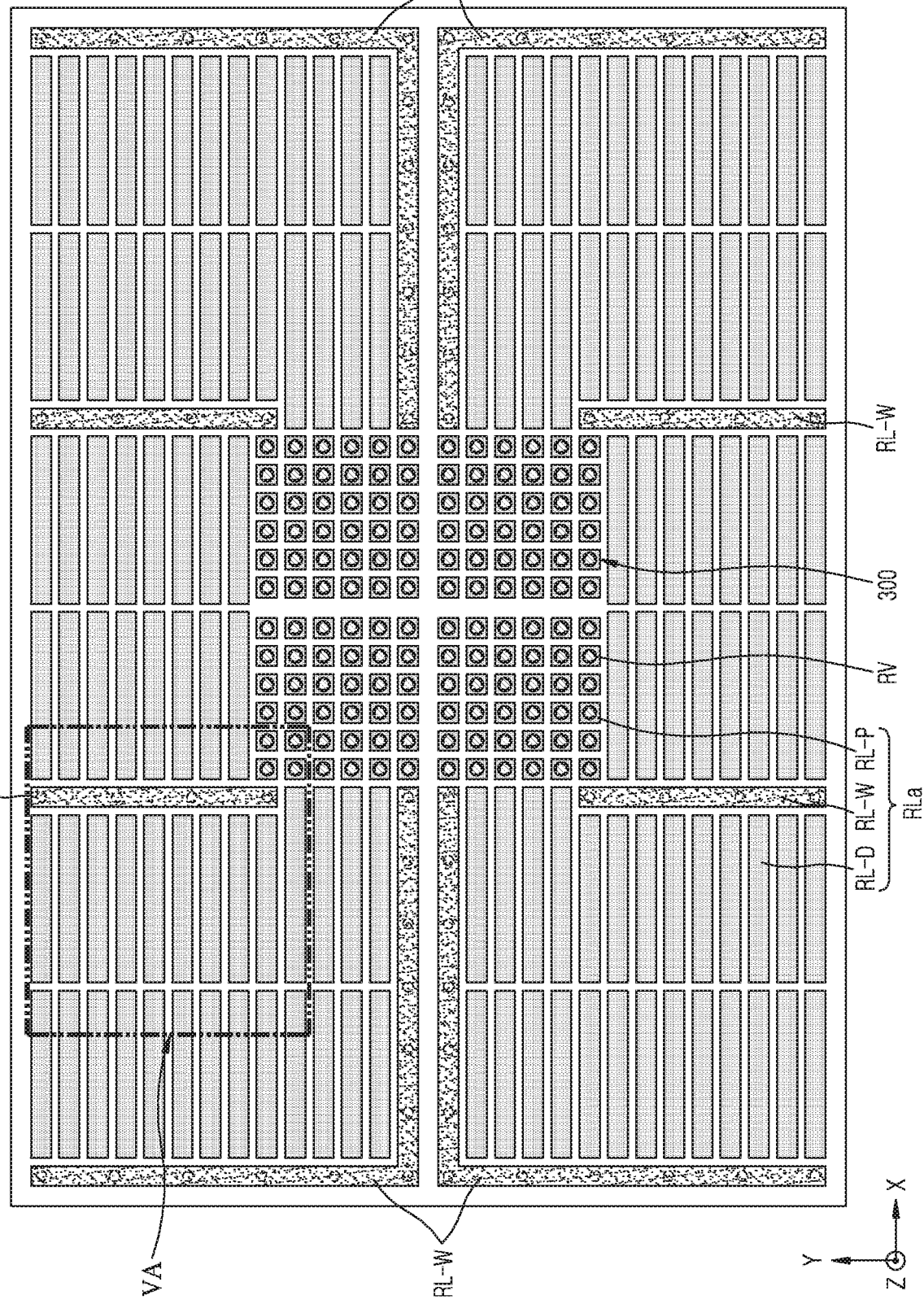
FIG. 4 is a plan layout diagram illustrating an integrated circuit device according to embodiments.
Figure 5A:
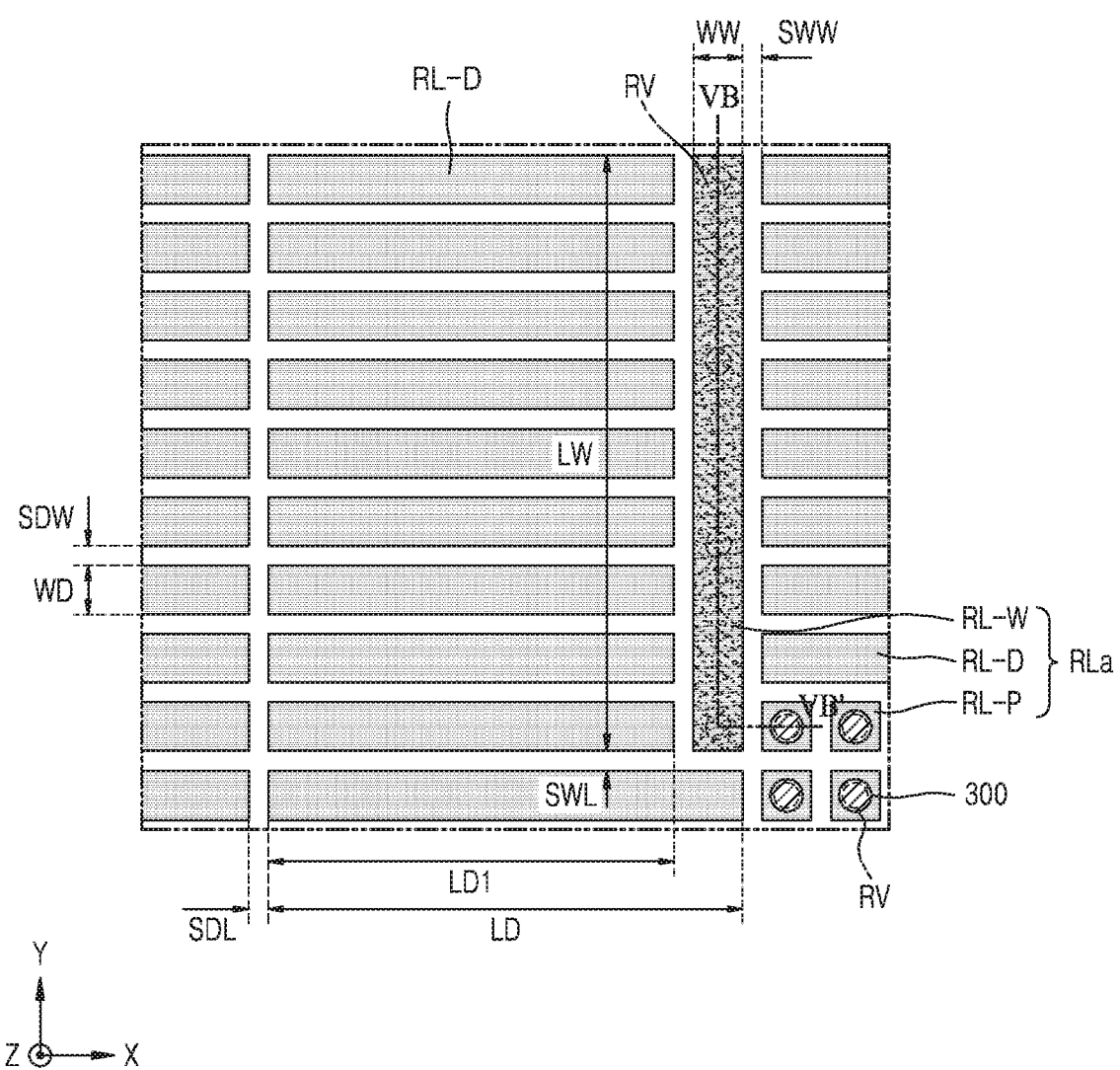
FIGS. 5A and 5B are a plan layout diagram and a cross-sectional view, respectively, illustrating an integrated circuit device according to embodiments.
Figure 5B:
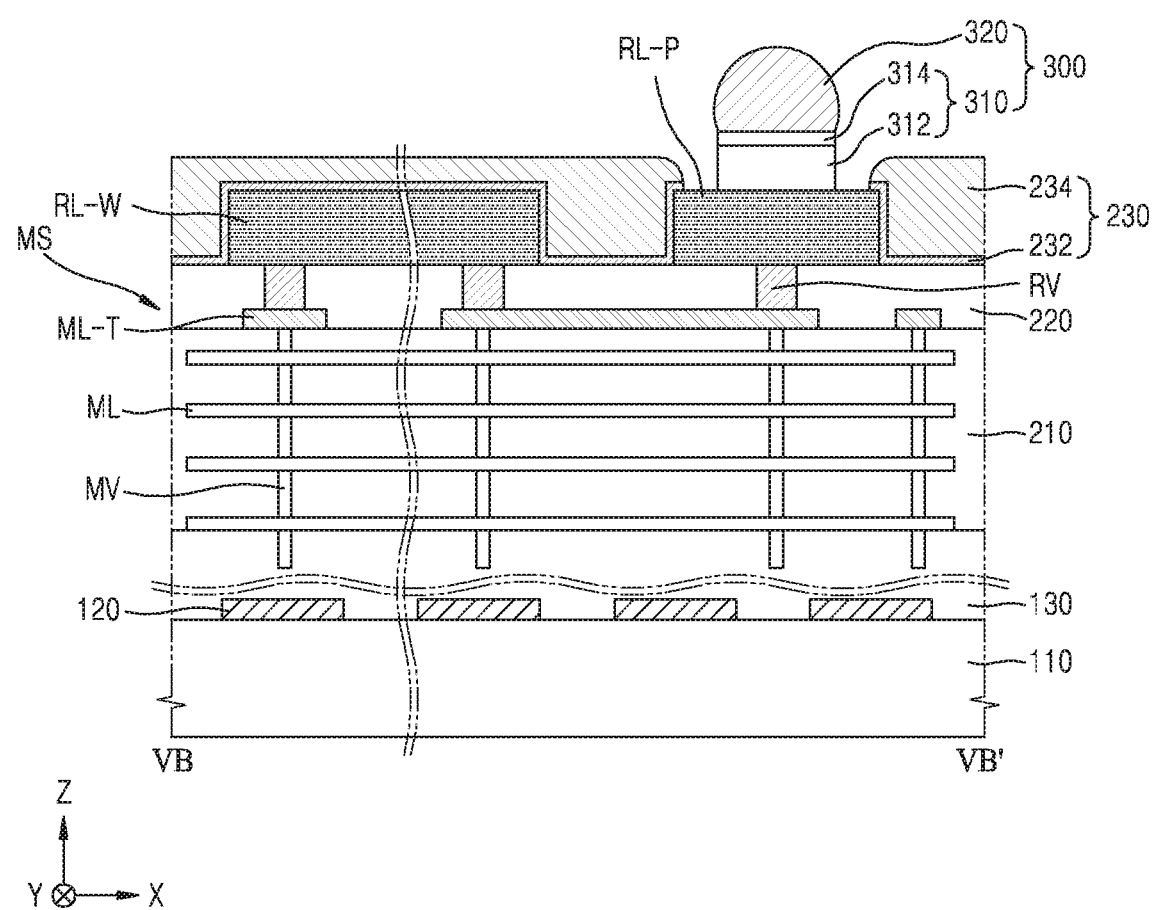

FIG. 4 is a plan layout diagram illustrating an integrated circuit device according to embodiments. FIGS. 5A and 5B are a plan layout diagram and a cross-sectional view, respectively, illustrating the integrated circuit device of FIG. 4 according to embodiments. In detail, FIG. 5A is a plan layout diagram illustrating an enlargement of a region VA of FIG. 4 and FIG. 5B is a cross-sectional view taken along a line VB-VB' of FIG. 5A. Like reference numerals refer to like elements throughout. Description of FIGS. 4 to 5B, which is previously given with reference to FIGS. 1A to 3, may be omitted for conciseness.

Referring to FIG. 4, an integrated circuit device 2 includes a plurality of redistribution patterns RLa. The plurality of redistribution patterns RLa may include a plurality of pad patterns RL-P, a plurality of power patterns RL-W, and a plurality of dummy patterns RL-D.

The plurality of pad patterns RL-P may be arranged in at least one column in the horizontal direction (the X direction or the Y direction). In some embodiments, the plurality of pad patterns RL-P may be horizontally arranged in a matrix. The plurality of connection terminals 300 may be connected to the plurality of pad patterns RL-P, respectively.

Each of the plurality of dummy patterns RL-D may be in the form of a line that extends in the first horizontal direction (the X direction) or the second horizontal direction (the Y direction). In some embodiments, the plurality of dummy patterns RL-D may be in the form of lines that extend in different directions.

Each of the plurality of dummy patterns RL-D may be in the form of a line that extends with a width of no less than about 20 μm and a length of about 100 μm to about 400 μm. For example, a ratio between the length and the width of each of the plurality of dummy patterns RL-D may be about 5:1 to about 20:1. The plurality of dummy patterns RL-D may be arranged at intervals of no more than about 10 μm. In some embodiments, a ratio between a planar area of the plurality of dummy patterns RL-D and a planar area of intervals among the plurality of dummy patterns RL-D may be about 3.5:1 to about 4.5:1.

In FIG. 4, it is illustrated that the plurality of dummy patterns RL-D extend with the same width and length. However, embodiments are not limited thereto. In some embodiments, the ratio between the length and the width of each of the plurality of dummy patterns RL-D may be about 5:1 to about 20:1 and a length or width of each of some of the plurality of dummy patterns RL-D may have a value different from that of a length or width of each of others of the plurality of dummy patterns RL-D. Alternatively, in some embodiments, the ratio between the planar area of the plurality of dummy patterns RL-D and the planar area of the intervals among the plurality of dummy patterns RL-D may be about 3.5:1 to about 4.5:1 and the length or width of each of some of the plurality of dummy patterns RL-D may have a value different from that of a length or width of each of others of the plurality of dummy patterns RL-D.

In some embodiments, a ratio between a planar area of the plurality of pad patterns RL-P and a planar area of intervals among the plurality of pad patterns RL-P may have a value that is the same as that of the ratio between the planar area of the plurality of dummy patterns RL-D and the planar area of the intervals among the plurality of dummy patterns RL-D. For example, the ratio between the planar area of the plurality of pad patterns RL-P and the planar area of the intervals among the plurality of pad patterns RL-P may be about 3.5:1 to about 4.5:1.

Each of the plurality of power patterns RL-W may be in the form of a line that linearly extends in the first horizontal direction (the X direction) or the second horizontal direction (the Y direction), or may be in the form of a line that extends in the first horizontal direction (the X direction) and the second horizontal direction (the Y direction). The power patterns RL-W that are in the form of a line that extends in the first horizontal direction (the X direction) and the second horizontal direction (the Y direction) may be said to be bent. In FIG. 4, exemplarily, it is illustrated that the plurality of power patterns RL-W that extend in the second horizontal direction (the Y direction) and extend in the first horizontal direction (the X direction), are bent once. However, embodiments are not limited thereto. For example, some of the plurality of power patterns RL-W may be in the form of lines that extend in the first horizontal direction (the X direction). Alternatively, in some embodiments, for example, others of the plurality of power patterns RL-W may be in the form of lines having portions that are bent no less than twice and extend in the first horizontal direction (the X direction) and the second horizontal direction (the Y direction).

Each of the plurality of pad patterns RL-P may be electrically connected to one redistribution via plug RV and one connection terminal 300. The plurality of dummy patterns RL-D may not be connected to the redistribution via plug RV and the connection terminal 300 and may be electrically isolated from the redistribution via plug RV and the connection terminal 300. Each of the plurality of power patterns RL-W may be electrically connected to at least two redistribution via plugs RV.

Referring to FIGS. 4 and 5A, a portion of the plurality of dummy patterns RL-D may be in the form of a line that extends with the first width WD and the first length LD. For example, the first width WD may have a value of no less than about 20 μm. For example, the first length LD may have a value of about 100 μm to about 400 μm. In some embodiments, the ratio between the first length LD and the first width WD may be about 5:1 to about 20:1. Another portion of the plurality of dummy patterns RL-D may be in the form of a line that extends with the first width WD and a length LD1 that is shorter than the first length LD. For example, the length LD1 may be shorter than the first length LD by a width WW of the power pattern RL-W and an interval SWW to be described further below.

The plurality of dummy patterns RL-D may be spaced apart from each other in a longitudinal direction at first longitudinal direction intervals SDL and in a width direction at first width direction intervals SDW. For example, the first longitudinal direction interval SDL may have a value of no more than about 10 μm. For example, the first width direction interval SDW may have a value of no more than about 10 μm. In some embodiments, the first longitudinal direction interval SDL and the first width direction interval SDW may have the same value or similar values.

In some embodiments, the ratio between the planar area of the plurality of dummy patterns RL-D and the planar area of the intervals among the plurality of dummy patterns RL-D may be about 3.5:1 to about 4.5:1.

Each of the plurality of power patterns RL-W may be in the form of a line that linearly extends with a second width WW and a second length LW, or extends by bending with a second width WW and a second length LW. For example, the second width WW may have a value of no less than about 20 µm. For example, the second length LW may have a value of about 100 µm to about 400 µm. In some embodiments, a ratio between the second length LW and the second width WW may be about 5:1 to about 20:1.

The plurality of power patterns RL-W may be spaced apart from the dummy patterns RL-D in a longitudinal direction at second longitudinal direction intervals SWL and in a width direction at second width direction intervals SWW. For example, the second longitudinal direction interval SWL may have a value of no more than about 10 µm. For example, the second width direction interval SWW may have a value of no more than about 10 µm. In some embodiments, the second longitudinal direction interval SWL and the second width direction interval SWW may have the same value or similar values.

In some embodiments, a ratio between a planar area of the plurality of power patterns RL-W and a planar area of intervals among the plurality of power patterns RL-W may have a value that is the same as that of the ratio between the planar area of the plurality of dummy patterns RL-D and the planar area of the intervals among the plurality of dummy patterns RL-D. In some embodiments, the ratio between the planar area of the plurality of power patterns RL-W and the planar area of the intervals among the plurality of power patterns RL-W may be about 3.5:1 to about 4.5:1.

In some embodiments, a ratio between a length and a width of each of the plurality of power patterns RL-W may be about 5:1 to about 20:1 and a length or a width of each of some of the plurality of power patterns RL-W may have a value different from that of a length or a width of each of others of the plurality of power patterns RL-W. Alternatively, in some embodiments, the ratio between the planar area of the plurality of power patterns RL-W and the planar area of the intervals among the plurality of power patterns RL-W may be about 3.5:1 to about 4.5:1 and the length or the width of each of some of the plurality of power patterns RL-W may have a value different from that of the length or the width of each of others of the plurality of power patterns RL-W.

Each of the plurality of power patterns RL-W may be electrically connected to at least two redistribution via plugs RV. At least two redistribution via plugs RV may be connected to a lower surface of each of the plurality of power patterns RL-W. Each of the plurality of power patterns RL-W may be electrically connected to a connection terminal 300, to which power is supplied, among the plurality of connection terminals 300 through the wiring structure MS and the via plug RV. For example, the connection terminal 300, to which power is supplied, among the plurality of connection terminals 300, may be electrically connected to the power pattern RL-W through the pad pattern RL-P, a via plug RV, the uppermost wiring layer ML-T, and another via plug RV. One power pattern RL-W is electrically connected to at least two redistribution via plugs RV and may transmit power supplied to the connection terminal 300 to the integrated circuit device 2.

In some embodiments, one power pattern RL-W may be connected to another via plug RV connected to one uppermost wiring layer ML-T connected through a pad pattern RL-P and one via plug RV and at least two other via plugs RV. Therefore, one power pattern RL-W may be electrically connected to portions of the uppermost wiring layer ML-T two-dimensionally positioned in another portion of the integrated circuit device 2 through at least two other via plugs RV.

As illustrated in FIG. 5B, an upper surface and side surfaces of each of the plurality of power patterns RL-W may be completely covered with the cover insulating layer 230. In the lower surface of each of the plurality of power patterns RL-W, a portion, to which at least two via plugs RV are not connected, may be covered with the second inter-wiring insulating layer 220.

For example, when the plurality of pad patterns RL-P, on which the plurality of connection terminals 300 are arranged, are center pads two-dimensionally arranged in the center of the integrated circuit device 2 as illustrated in FIG. 4, or are edge pads two-dimensionally arranged to be adjacent to edges of the integrated circuit device 2, power loss may occur while power supplied through some of the plurality of connection terminals 300 is two-dimensionally transmitted to a portion of the integrated circuit device 2 spaced apart from the plurality of pad patterns RL-P or power is two-dimensionally transmitted to other portions of the integrated circuit device 2 through one power pattern RL-W. However, power may be transmitted to the integrated circuit device 2 according to various embodiments through a power pattern RL-W that is a redistribution pattern RL having a large thickness and width thereby minimizing power loss. Therefore, since power is transmitted to the integrated circuit device 2 with minimized power loss, a high speed operation of the integrated circuit device 2 may be implemented.

Although a plurality of redistribution patterns RLa including the plurality of power patterns RL-W are formed to be thick in the integrated circuit device 2 according to various embodiments in order to minimize loss of power for implementing a high speed operation, since the plurality of redistribution patterns RLa two-dimensionally have uniform density, that is, a ratio between a planar area of the plurality of redistribution patterns RLa and a planar area of intervals among the plurality of redistribution patterns RLa is about 3.5:1 to about 4.5:1, it is possible to prevent the integrated circuit device 2 from being bent due to the plurality of redistribution patterns RLa. Therefore, the reliability of the integrated circuit device 2 may increase and the reliability of electric connection between the plurality of connection terminals 300 arranged on the plurality of pad patterns RL-P and an external device may increase.

When the plurality of redistribution patterns RLa are formed to be thick, since distortion may occur at planar shapes of the plurality of redistribution patterns RLa due to grain boundaries among metal layers that form the plurality of redistribution patterns RL, it may be difficult to detect defects in the plurality of redistribution patterns RLa. However, since the plurality of redistribution patterns RLa in the integrated circuit device 2 according to various embodiments include the plurality of dummy patterns RL-D and the plurality of power patterns RL-W having a large width and length, distortion that occurs at the planar shapes of the plurality of redistribution patterns RLa due to the grain boundaries may be minimized. Therefore, since a defect that may occur in the plurality of redistribution patterns RLa may be easily detected, the integrated circuit device 2 without a defect may be formed.

Figure 7A:
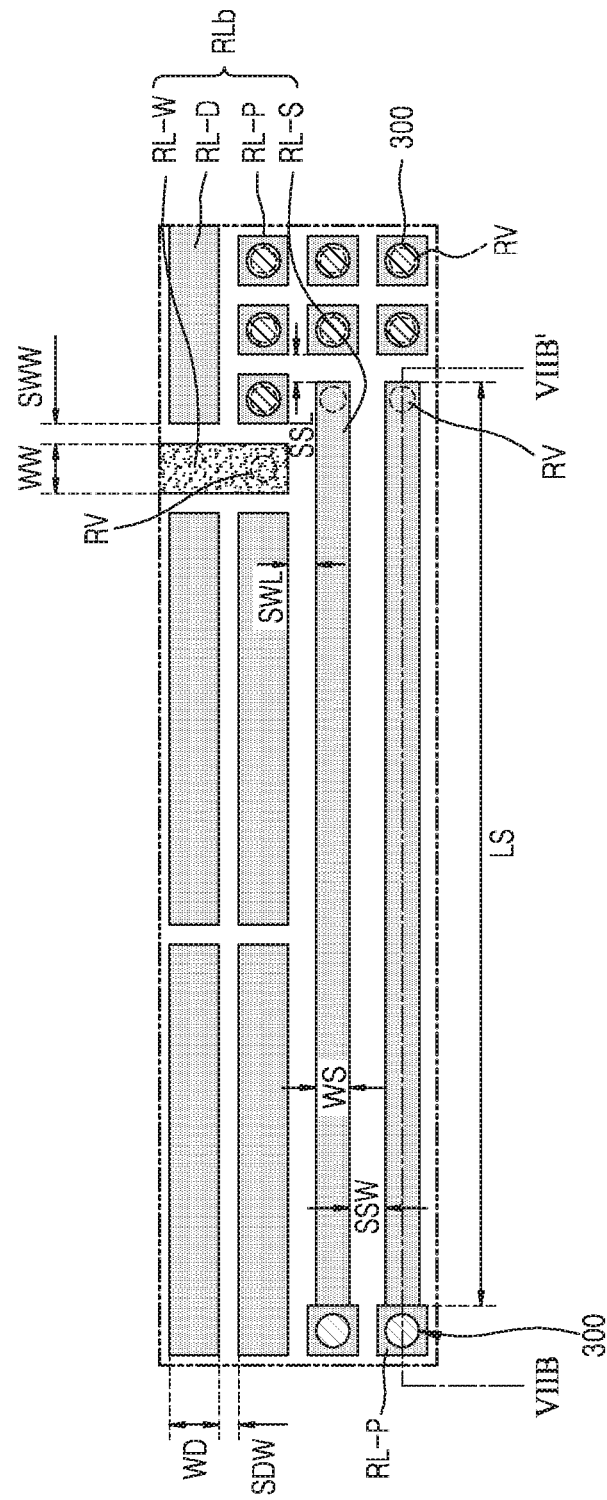
FIGS. 7A and 7B are a plan layout diagram and a cross-sectional view, respectively, illustrating an integrated circuit device according to embodiments.
Figure 7B:
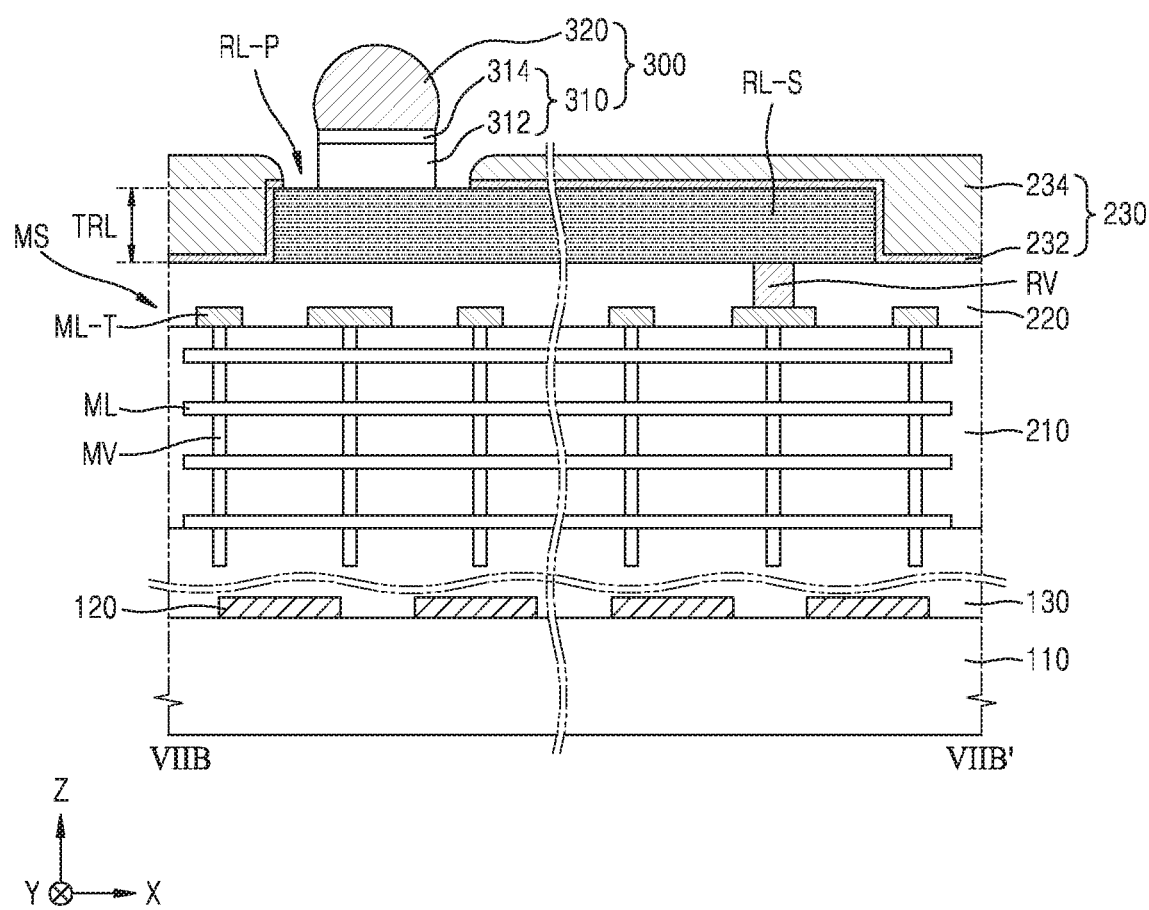

FIG. 6 is a plan layout diagram illustrating an integrated circuit device according to embodiments. FIGS. 7A and 7B are a plan layout diagram and a cross-sectional view, respectively, illustrating an integrated circuit device according to embodiments. In detail, FIG. 7A is a plan layout diagram illustrating an enlargement of the portion VIIA of FIG. 6 and FIG. 7B is a cross-sectional view taken along the line VIIB-VIIB' of FIG. 7A. Like reference numerals refer to like elements throughout. Description of FIGS. 6 to 7B, which is previously given with reference to FIGS. 1A to 5B, may be omitted for conciseness.

Referring to FIG. 6, an integrated circuit device 3 includes a plurality of redistribution patterns RLb. The plurality of redistribution patterns RLb may include a plurality of pad patterns RL-P, at least one power pattern RL-W, a plurality of signal patterns RL-S, and a plurality of dummy patterns RL-D.

The plurality of pad patterns RL-P may be arranged in at least one column in the horizontal direction (the X direction or the Y direction). The plurality of connection terminals 300 may be connected to the plurality of pad patterns RL-P, respectively. Each of the plurality of dummy patterns RL-D may be in the form of a line that extends in the first horizontal direction (the X direction) or the second horizontal direction (the Y direction). Each of the plurality of power patterns RL-W may be in the form of a line that linearly extends in the first horizontal direction (the X direction) or the second horizontal direction (the Y direction), or may be in the form of a line that extends with bending.

In some embodiments, a ratio between a planar area of the plurality of pad patterns RL-P and a planar area of intervals among the plurality of pad patterns RL-P, a ratio between a planar area of the plurality of dummy patterns RL-D and a planar area of intervals among the plurality of dummy patterns RL-D, and a ratio between a planar area of the plurality of power patterns RL-W and a planar area of intervals among the plurality of power patterns RL-W may have the same value.

Each of the plurality of signal patterns RL-S may be in the form of a line that linearly extends in the first horizontal direction (the X direction) or the second horizontal direction (the Y direction), or may be in the form of a line that extends with bending. In FIG. 6, exemplarily, it is illustrated that the plurality of signal patterns RL-S are in the form of lines that extend in the first horizontal direction (the X direction). However, embodiments are not limited thereto. For example, in some embodiments, a portion of the plurality of signal patterns RL-S may be in the form of lines that extend in the second horizontal direction (the Y direction). Alternatively, in some embodiments, for example, a portion of the plurality of signal patterns RL-S may be in the form of lines having portions that are bent no less than once and extend in the first horizontal direction (the X direction) and the second horizontal direction (the Y direction).

One end of each of the plurality of signal patterns RL-S (e.g., an inside end in the example illustrated in FIGS. 7A-7B) may be connected to a redistribution via plug RV and the other end (e.g., an outside end in the example illustrated in FIGS. 7A-7B) of each of the plurality of signal patterns RL-S may be connected to a pad pattern RL-P. The redistribution via plug RV may be connected to a lower surface of the one end of each of the plurality of signal patterns RL-S. A connection terminal 300 may be arranged on the pad pattern RL-P connected to the other end of each of the plurality of signal patterns RL-S.

Among the plurality of pad patterns RL-P, the redistribution via plug RV may not be connected to a lower surface of a pad pattern RL-P that is connected to the other end of one of the plurality of signal patterns RL-S. Among the plurality of pad patterns RL-P, the redistribution via plug RV may be connected to a lower surface of a pad pattern RL-P that is not connected to one of the plurality of signal patterns RL-S.

Each of the plurality of signal patterns RL-S may be in the form of a line that linearly extends or extends with bending with a third width WS and a third length LS. For example, the third width WS may have a value less than those of the first width WD and the second width WW. For example, the third length LS may have a value of about 100 μm to about 400 μm. In some embodiments, a ratio between the third length LS and the third width WS may have a value greater than that of a ratio between the first length LD and the first width WD.

The plurality of signal patterns RL-S may be spaced apart from the other patterns at a third longitudinal direction interval SSL and a third width direction interval SSW. In more detail, the plurality of signal patterns RL-S may be spaced apart from the plurality of pad patterns RL-P, the plurality of dummy patterns RL-D, or the other signal patterns RL-S at third longitudinal direction intervals SSL and at third width direction intervals SSW. For example, the third longitudinal direction interval SSL may be the same as or greater than the first longitudinal direction interval (SDL of FIG. 2A or 5A). For example, the third width direction interval SSW may have a value greater than those of the first width direction interval SDW and the second width direction interval SWW.

In some embodiments, a ratio between a planar area of the plurality of signal patterns RL-S and a planar area of intervals among the plurality of signal patterns RL-S may have a value different from that of a ratio between the planar area of the plurality of dummy patterns RL-D and the planar are of the intervals among the plurality of dummy patterns RL-D. For example, the ratio between the planar area of the plurality of signal patterns RL-S and the planar area of the intervals among the plurality of signal patterns RL-S may have a value greater than that of the ratio between the planar area of the plurality of dummy patterns RL-D and the planar area of the intervals among the plurality of dummy patterns RL-D.

Figure 8:
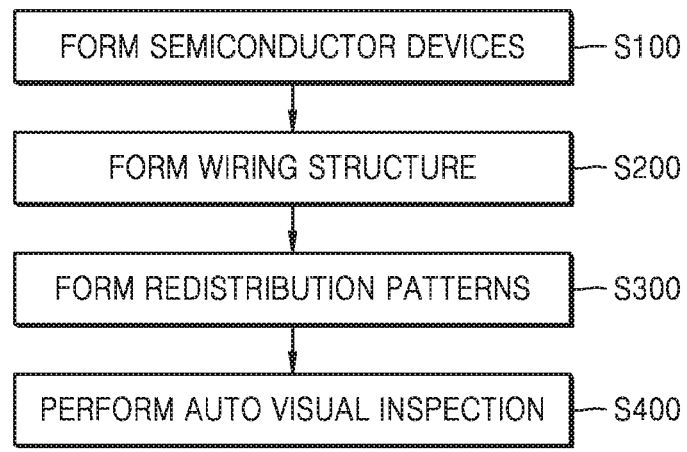
FIG. 8 is a flowchart illustrating a method of manufacturing an integrated circuit device, according to embodiments.

FIG. 8 is a flowchart illustrating a method of manufacturing an integrated circuit device, according to embodiments. In detail, FIG. 8 is a flowchart illustrating a method of manufacturing the integrated circuit devices 1, 1A, 2, and 3 described in FIGS. 1 to 7B. Description of FIG. 8, which is previously given with reference to FIGS. 1A to 7B, may be omitted for conciseness. FIG. 8 will be described with reference to FIGS. 1A to 7B.

Referring to FIG. 8, semiconductor devices are formed on a substrate 110 in operation S100. For example, the device layer 130 including the plurality of semiconductor devices 120 is formed on the substrate 110. The substrate 110 may include, for example, silicon (Si). Alternatively, in some embodiments, the substrate 110 may include a semiconductor element such as Ge or a compound semiconductor such as SiC, GaAs, InAs, or InP.

At least some of the plurality of semiconductor devices 120 may be transistors. In some embodiments, the plurality of semiconductor devices 120 may be various kinds of separate devices for forming a DRAM device, an SRAM device, a flash memory device, an EEPROM device, a PRAM device, an MRAM device, or a RRAM device. For example, the plurality of semiconductor devices 120 may be various kinds of separate devices for forming a high bandwidth memory (HBM) DRAM device and the integrated circuit devices 1, 1a, 2, and 3 may be the HBM DRAM devices.

In other embodiments, the plurality of semiconductor devices 120 may form a logic cell. For example, the integrated circuit devices 1, 1a, 2, and 3 may be CPUs, GPUs, or APs.

A wiring structure is formed in operation S200. For example, the wiring structure MS and the first inter-wiring insulating layer 210 that surrounds the wiring structure MS may be formed on the substrate 110 on which the device layer 130 is formed. The wiring structure MS may include the plurality of wiring layers ML and the plurality of via plugs MV connected to the plurality of wiring layers ML.

In some embodiments, each of the uppermost wiring layers ML-T arranged at the uppermost ends of the plurality of wiring layers ML may have a first thickness TML1 and each of the remaining wiring layers ML may have a second thickness TML2 having a value less than that of the first thickness TML1. For example, the first thickness TML1 may have a value of no more than about 0.5 µm. For example, the second thickness TML2 may have a value less than that of the first thickness TML1, that is, a value of no more than about 0.3 µm.

Redistribution patterns are formed in operation S300. For example, the second inter-wiring insulating layer 220 and the redistribution via plug RV connected to the wiring structure MS through the second inter-wiring insulating layer 220 may be formed on the wiring structure MS and the first inter-wiring insulating layer 210, and a plurality of redistribution patterns RL, RLa, and RLb may be formed on the second inter-wiring insulating layer 220 and the redistribution via plug RV.

The plurality of redistribution patterns RL, RLa, and RLb may have a third thickness TRL. The third thickness TRL may have a value of no less than twice that of the first thickness TML1. For example, the third thickness TRL may be about 1 µm to about 5 µm.

In some embodiments, the plurality of redistribution patterns RL may include the plurality of pad patterns RL-P and the plurality of dummy patterns RL-D. In some embodiments, the plurality of redistribution patterns RLa may include the plurality of pad patterns RL-P, the plurality of power patterns RL-W, and the plurality of dummy patterns RL-D. In other embodiments, the plurality of redistribution patterns RLb may include the plurality of pad patterns RL-P, the at least one power pattern RL-W, the plurality of signal patterns RL-S, and the plurality of dummy patterns RL-D.

After forming the plurality of redistribution patterns RL, RLa, and RLb, auto visual inspection (AVI) may be performed in operation S400. For example, auto visual inspection (AVI) may be performed on the plurality of redistribution patterns RL, RLa, and RLb.

When the plurality of redistribution patterns RL, RLa, and RLb are formed to have a third thickness TRL, which is large, since distortion may occur at planar shapes of the plurality of redistribution patterns RL, RLa, and RLb due to grain boundaries among metal layers that form the plurality of redistribution patterns RL, RLa, and RLb, it may be difficult to detect defects in the plurality of redistribution patterns RL, RLa, and RLb.

However, since the plurality of redistribution patterns RL, RLa, and RLb according to the embodiments disclosed herein include the plurality of dummy patterns RL-D and the plurality of power patterns RL-W having a larger width and length than that of the plurality of pad patterns RL-P or the plurality of signal patterns RL-S, distortion that occurs at the planar shapes of the plurality of redistribution patterns RL, RLa, and RLb due to the grain boundaries may be minimized. Therefore, a defect that may occur in the plurality of redistribution patterns RL, RLa, and RLb may be easily detected. Therefore, although defects are not directly detected in the plurality of pad patterns RL-P or the plurality of signal patterns RL-S having a smaller width and length, since detects may be detected through the plurality of dummy patterns RL-D and/or the plurality of power patterns RL-W having a larger width and length, detects in the plurality of redistribution patterns RL, RLa, and RLb may be determined.

Therefore, the integrated circuit devices 1, 1a, 2, and 3 without defects and with improved reliability may be formed.

While the inventive concept has been particularly shown and described with reference to various embodiments thereof, it will be understood that various changes in form and details may be made therein without departing from the spirit and scope of the following claims.

What is claimed is:
1. An integrated circuit device comprising:
a wiring structure including a plurality of wiring layers having a multilayer wiring structure and a plurality of via plugs, and a first inter-wiring insulating layer configured to surround the wiring structure on a substrate;
a second inter-wiring insulating layer and a plurality of redistribution via plugs connected to the wiring structure through the second inter-wiring insulating layer on the first inter-wiring insulating layer;
a plurality of redistribution patterns including a plurality of pad patterns and a plurality of dummy patterns on the second inter-wiring insulating layer, each of the plurality of pad patterns and each of the plurality of dummy patterns having a thickness greater than a thickness of each of the plurality of wiring layers; and
a cover insulating layer configured to cover a portion of the plurality of redistribution patterns,
wherein the plurality of dummy patterns extend in lines in a horizontal direction parallel to the substrate and are completely surrounded by the second inter-wiring insulating layer and the cover insulating layer so as to be electrically isolated from each other,
wherein the plurality of dummy patterns are spaced apart from each other at longitudinal direction intervals in a longitudinal direction and at width direction intervals in a width direction, and
wherein each of the plurality of dummy patterns has a first width and a first length and extends in the horizontal direction.
2. The integrated circuit device of claim 1,
wherein each of the longitudinal direction intervals and each of the width direction intervals has a value of no more than ½ of the first width.
3. The integrated circuit device of claim 2, wherein the plurality of redistribution patterns further comprise a plurality of power patterns each linearly extending and having a second width and a second length, and
wherein a lower surface of each of the plurality of power patterns is connected to at least two of the plurality of redistribution via plugs and an upper surface and side surfaces of each of the plurality of power patterns are covered with the cover insulating layer.
4. The integrated circuit device of claim 3, wherein each of a ratio between the first length and the first width and a ratio between the second length and the second width is 5:1 to 20:1.
5. The integrated circuit device of claim 3, wherein each of the first length and the second length has a value of no less than 100 µm and each of the first width and the second width has a value of no less than 20 µm.
6. The integrated circuit device of claim 3, wherein each of the longitudinal direction intervals and each of the width direction intervals has a value of no more than 10 µm.

7. The integrated circuit device of claim 3, wherein
one of the plurality of power patterns is electrically connected to one of a plurality of connection terminals through one of the plurality of redistribution via plugs, one of the plurality of wiring layers, another one of the plurality of redistribution via plugs, and one of the plurality of pad patterns.

8. The integrated circuit device of claim 1, wherein
a thickness of each of the plurality of redistribution patterns has a value of no less than twice that of a thickness of each of the plurality of wiring layers.

9. The integrated circuit device of claim 8, wherein
the thickness of each of the plurality of redistribution patterns has a value of no less than 1 µm and a thickness of an uppermost wiring layer arranged at an uppermost end of the plurality of wiring layers has a value of no more than 0.5 µm.

10. The integrated circuit device of claim 1, wherein
a ratio between a planar area of the plurality of redistribution patterns and a planar area of intervals among the plurality of redistribution patterns is 3.5:1 to 4.5:1.

11. An integrated circuit device comprising:
a wiring structure including a plurality of wiring layers having a multilayer wiring structure and a plurality of via plugs, and a first inter-wiring insulating layer configured to surround the wiring structure on a substrate;
a second inter-wiring insulating layer and a plurality of redistribution via plugs connected to the wiring structure through the second inter-wiring insulating layer on the first inter-wiring insulating layer;
a plurality of redistribution patterns including a plurality of pad patterns, a plurality of dummy patterns, and a plurality of power patterns on the second inter-wiring insulating layer, each of the plurality of pad patterns, the plurality of dummy patterns, and the plurality of power patterns having a thickness no less than twice a thickness of each of the plurality of wiring layers;
a cover insulating layer configured to cover the plurality of dummy patterns and the plurality of power patterns and to not cover at least a portion of the plurality of pad patterns; and
a plurality of connection terminals connected to the plurality of pad patterns, respectively,
wherein the plurality of dummy patterns extend in lines in a horizontal direction parallel to the substrate and are completely surrounded by the second inter-wiring insulating layer and the cover insulating layer so as to be electrically isolated from each other, and
wherein the plurality of dummy patterns are spaced apart from each other at longitudinal direction intervals in a longitudinal direction and at width direction intervals in a width direction, and
wherein each of the plurality of dummy patterns has a first width and a first length and extends in the horizontal direction.

12. The integrated circuit device of claim 11, wherein
a ratio between a planar area of the plurality of redistribution patterns and a planar area of intervals among the plurality of redistribution patterns is 3.5:1 to 4.5:1.

13. The integrated circuit device of claim 11, wherein a part of a lower surface of each of the plurality of power patterns is covered with the second inter-wiring insulating layer and at least two of the plurality of redistribution via plugs are connected to a remaining part that is not covered with the second inter-wiring insulating layer, and
wherein an upper surface and side surfaces of each of the plurality of power patterns are covered with the cover insulating layer.

14. The integrated circuit device of claim 11,
wherein each of the longitudinal direction intervals and each of the width direction intervals has a value of no more than ½ of the first width.

15. The integrated circuit device of claim 14, wherein
a ratio between the first length and the first width is 5:1 to 20:1.

16. An integrated circuit device comprising:
a device layer including a plurality of semiconductor devices on a substrate;
a wiring structure including a plurality of wiring layers having a multilayer wiring structure including an uppermost wiring layer and a plurality of via plugs on the device layer;
a first inter-wiring insulating layer configured to surround the wiring structure on the device layer;
a second inter-wiring insulating layer on the first inter-wiring insulating layer and the wiring structure;
a plurality of redistribution via plugs connected to the uppermost wiring layer through the second inter-wiring insulating layer;
a plurality of redistribution patterns including a plurality of pad patterns, a plurality of dummy patterns and a plurality of power patterns, each of the plurality of pad patterns being connected to one of the plurality of redistribution via plugs on the second inter-wiring insulating layer, each of the plurality of dummy patterns being extending in a line in a horizontal direction parallel to the substrate, and each of the plurality of power patterns being connected to at least two of the plurality of redistribution via plugs and having a thickness no less than twice a thickness of the uppermost wiring layer;
a cover insulating layer configured to cover the plurality of dummy patterns and the plurality of power patterns; and
a plurality of connection terminals that are connected to the plurality of pad patterns, respectively, each of the plurality of connection terminals including a conductive pillar and a conductive cap configured to cover an upper surface of the conductive pillar,
wherein the plurality of dummy patterns are completely surrounded by the second inter-wiring insulating layer and the cover insulating layer and are electrically isolated from each other, and
wherein, among an upper surface, side surfaces, and a lower surface of each of the plurality of power patterns, a portion that is not connected to the at least two redistribution via plugs is covered with the second inter-wiring insulating layer and the cover insulating layer, and
wherein each of the plurality of dummy patterns are spaced apart from each other at longitudinal direction intervals in a longitudinal direction and at width direction intervals in a width direction, and
wherein each of the plurality of dummy patterns has a width and a length and extends in the horizontal direction.

17. The integrated circuit device of claim 16, wherein
the longitudinal direction intervals and the width direction intervals among the plurality of dummy patterns each have a value of no more than ½ of a width of each of the plurality of dummy patterns.

18. The integrated circuit device of claim 16, wherein each of a ratio between a planar area of the plurality of dummy patterns and a planar area of the longitudinal direction intervals and the width direction interval among the plurality of dummy patterns and a ratio between a planar area of the plurality of power patterns and a planar area of intervals among the plurality of power patterns is 3.5:1 to 4.5:1.

19. The integrated circuit device of claim 16, wherein a ratio between the length and the width of each of the plurality of dummy patterns is 5:1 to 20:1.

20. The integrated circuit device of claim 16, wherein each of the plurality of dummy patterns extends with the width of no less than 20 μm and the length of 100 μm to 400 μm.

* * * * *